US010913996B2

(12) United States Patent
Moreni et al.

(10) Patent No.: US 10,913,996 B2
(45) Date of Patent: Feb. 9, 2021

(54) VACUUM COATING APPARATUS

(71) Applicant: Satisloh AG, Baar (CH)

(72) Inventors: Franco Moreni, Olgiate Olona (IT);
Antonio Corea, Sedriano (IT);
Giuseppe Viscomi, Senago (IT)

(73) Assignee: Satisloh AG

( * ) Notice: Subject to any disclaimer, the term of this patent is extended or adjusted under 35 U.S.C. 154(b) by 182 days.

(21) Appl. No.: 16/334,133

(22) PCT Filed: Sep. 6, 2017

(86) PCT No.: PCT/EP2017/001051
§ 371 (c)(1),
(2) Date: Mar. 18, 2019

(87) PCT Pub. No.: WO2018/050270
PCT Pub. Date: Mar. 22, 2018

(65) Prior Publication Data
US 2019/0376176 A1 Dec. 12, 2019

(30) Foreign Application Priority Data

Sep. 16, 2016 (EP) ..................... 16002019

(51) Int. Cl.
*C23C 14/04* (2006.01)
*C23C 14/50* (2006.01)
(52) U.S. Cl.
CPC .......... *C23C 14/044* (2013.01); *C23C 14/505* (2013.01)
(58) Field of Classification Search
CPC .................................. C23C 14/044
See application file for complete search history.

(56) References Cited

U.S. PATENT DOCUMENTS 6,375,747 B1 * 4/2002 Beinat .................. C23C 14/044
118/720
7,311,939 B2 12/2007 Zültzke et al.

FOREIGN PATENT DOCUMENTS

JP 2005320605 * 11/2005 ........... C23C 14/044

OTHER PUBLICATIONS

Extended European Search Report; Applicant: Satisloh AG; Application No. 16002019.4-1373; dated Feb. 20, 2017; 5 pages.
International Search Report; Applicant: Satisloh AG; Application No. PCT/EP2017/001051; Filing Date Sep. 6, 2017, dated Oct. 11, 2017; 11 Pages.

* cited by examiner

*Primary Examiner* — Keath T Chen
(74) *Attorney, Agent, or Firm* — Reising Ethington P.C.

(57) ABSTRACT

A box coating apparatus for vacuum coating of substrates has a vacuum chamber containing an evaporation source and a substrate holder formed as a dome related to the evaporation source and rotatable about an axis. A masking arrangement is located in between for partially shadowing the substrates on the substrate holder relative to the evaporation source. The masking arrangement comprises a fixed masking portion stationary in the vacuum chamber, and a plurality of gradient sector portions carrying gradient shields assigned to the substrates on the substrate holder, for forming a gradient mask. The gradient sector portions can be rotated about the axis between a gradient mask open position where they are stored behind the fixed masking portion, and a gradient mask closed position where they are spread like a fan between the evaporation source and the substrate holder.

22 Claims, 18 Drawing Sheets

VACUUM COATING APPARATUS

TECHNICAL FIELD OF THE INVENTION

The present invention generally relates to a box coating apparatus for vacuum coating of substrates. In particular, the present invention relates to a box coating apparatus for vacuum coating of spectacle lens blanks, which shall be used within the frame of large-scale production of so-called "gradient lenses". A gradient lens is a type of lens which, for example for aesthetic reasons, is coated with a tint in such a way that the individual lens is darker in color at the top of the lens, and then, moving down the lens, the color lightens until it is no longer visible on the lens.

PRIOR ART

In order to obtain gradient lenses screens have already been proposed which shadow regions of the substrate area to be coated with respect to the evaporator crucible, so that the zones of the substrate which lie in the shadow or half-shadow of the screen are vapor-coated less intensely than the exposed zones.

In this context document U.S. Pat. No. 7,311,939 B2 discloses a vacuum coating unit for simultaneously coating a plurality of substrates in a vacuum chamber. The known vacuum coating unit includes an evaporation crucible defining a vertical axis of symmetry, a substrate holder formed as a dome disposed above the evaporation crucible and having an underside configuration to hold a plurality of substrates at radially equal intervals in a ring of substrates about the vertical axis of symmetry of the evaporation crucible and stationary relative to the dome, and a rotary drive for rotating the dome about the axis of symmetry, whereby the substrates are moved on circular paths about the axis of symmetry.

So as to obtain layer thickness or color variations on the substrates during coating the known vacuum coating unit further has a masking arrangement located in the vacuum chamber between the evaporation crucible and the substrate holder for partially shadowing the substrates held by the substrate holder relative to the evaporation crucible. To be more precise, this masking arrangement comprises at least one continuous, i.e. closed circular aperture ring formed of screens, which is associated, with regard to an evaporation from the evaporation crucible to the substrate holder, with a respective ring of substrates and disposed, circumferentially relative to the axis of symmetry, within a cone formed between the evaporator crucible and the dome. This aperture ring thus acts for a group of substrates which are fitted to the substrate holder on a circle.

In this prior art it is further proposed to vary the transition between the coated and partly coated zones on the substrates, among others, by changing the distance of the aperture ring from the substrate holder. The more closely to the substrates the aperture ring is located, the sharper the transition becomes. In order to be able to configure the transition to be softer or harder, provision is made in this prior art for the distance between the substrate holder and the aperture ring to be adjustable in the vertical direction, that is to say parallel to the axis of symmetry. For this purpose, inside the vacuum chamber, a vertical drive is provided for the aperture ring, which can be actuated by a controller.

Although it is foreseen in this prior art to actuate the vertical drive for the aperture ring also during the coating operation, the aperture ring nevertheless always remains between the evaporation crucible and the substrate holder and, accordingly, provides a shadowing effect for at least a part of the substrates all the time. There is no disclosure to move the aperture ring to avoid any shadowing or screening effect. Therefore, any further coating steps to be carried out in this coating unit without screening effect to fully impinge on the whole area of the substrates facing the evaporation crucible, such as antireflection (AR) coating steps or the like, require that the vacuum in the vacuum chamber be released and the vacuum chamber be opened to remove the aperture ring before the vacuum chamber can be closed again so as to generate a vacuum for the desired non-screened coating steps. This procedure however is time-consuming and as such not desirable to be conducted in the mass production of spectacle lenses.

What is desired is creating a box coating apparatus for vacuum coating of substrates, in particular spectacle lens blanks, in which vacuum coating steps both with and without screening effect for layer thickness or color variations can be carried out in a more efficient manner so that the box coating apparatus is especially suitable to be deployed within the frame of large-scale production of gradient spectacle lenses.

SUMMARY OF THE INVENTION

According to one aspect of the invention a box coating apparatus for vacuum coating of substrates, in particular spectacle lens blanks, includes a vacuum chamber that contains an evaporation source and a substrate holder for holding a plurality of substrates. The substrate holder is formed as a dome disposed relative to the evaporation source and rotatable by a dome rotary drive about an axis of rotation that passes through the evaporation source, so that substrates held by the substrate holder can be moved on circular paths about the axis of rotation with a respective constant spacing relative to the evaporation source. The box coating apparatus further has a masking arrangement located in the vacuum chamber between the evaporation source and the substrate holder for partially shadowing the substrates held by the substrate holder relative to the evaporation source. The masking arrangement includes a fixed masking portion that is stationary in the vacuum chamber, and a plurality of gradient sector portions each carrying gradient shields assigned to the substrates held by the substrate holder, for forming a gradient mask, wherein the gradient sector portions can be rotated about the axis of rotation between a gradient mask open position in which the gradient sector portions are stored behind the fixed masking portion, and a gradient mask closed position in which the gradient sector portions are spread like a fan between the evaporation source and the substrate holder.

Accordingly, within the vacuum chamber of the box coating apparatus, the masking arrangement can selectively assume two different states, namely either a screening or shading state (gradient mask closed position) or a non-screening or non-shading state (gradient mask open position). In the screening or shading state of the masking arrangement the gradient sector portions are swung out from behind the fixed masking portion so that the evaporated material which is emitted from the evaporation source impinges on and has to pass the gradient shields in a defined manner before it hits the substrates held by the rotating substrate holder. By contrast, in the non-screening or non-shading state of the masking arrangement, the gradient sector portions are swiveled into their storage space behind the fixed masking portion so that the evaporated material— beside or outside the area covered by the fixed masking portion—freely and directly impinges on the substrates circulated via the substrate holder. According to the invention, it is therefore possible to carry out in situ coating steps both with and without shadowing effect for layer thickness or color variations. In doing so the individual coating steps can be conducted in direct succession under the same vacuum conditions. In other words, according to the invention, it is not required to open and close the vacuum chamber, i.e. to release and build up again the vacuum in the vacuum chamber between the individual coating steps with and without shadowing effect. As a result, the overall process of coating, in particular, gradient spectacle lenses with coating layer thickness and/or color variations can be performed with considerable time savings and thus in a very efficient manner.

In principle, it is possible to provide the masking arrangement with four or more movable gradient sector portions, also of different size and shape, as required. With respect to low complexity and expenditure it is, however, preferred if the masking arrangement comprises three gradient sector portions which are about the same size and shape and can be stored behind the fixed masking portion in a stacked arrangement. The provision of three gradient sector portions only further has the advantage that the differences in free distance between the individual gradient shields carried by the respective gradient sector portion and the assigned substrates held by the substrate holder are small only from one to the other gradient sector portion so that the shadowing effects of the gradient sector portions are essentially the same.

With regard to a simple structure of the masking arrangement it is further preferred if the gradient sector portions are swivel-mounted in the vacuum chamber by a common central shaft aligned with the axis of rotation. In one example, a plurality of hollow shafts may be coaxially arranged with respect to the axis of rotation and each assigned to a respective one of the gradient sector portions in order to, individually drive the gradient sector portions if desired.

As indicated before, in principle, several possibilities of driving the individual gradient sector portions can be provided for, so that the gradient sector portions can be pivoted individually to a masking position or not, as desired. However, with respect to low complexity and expenditure again it is preferred if a first one of the gradient sector portions is connected to rotate with the central shaft, whereas the other gradient sector portions are mounted on the central shaft to be pivotable with respect to the central shaft, wherein the other gradient sector portions are further adapted to be moved along by the first gradient sector portion in a successive manner upon rotation thereof with the central shaft, so as to either close or open the gradient mask depending on the direction of rotation of the central shaft.

In an advantageous embodiment of the box coating apparatus the masking driving configuration further can be such that adjacent gradient sector portions in each case comprise cooperating driving projections which are arranged to successively come into engagement with each other upon rotation of the central shaft. Such direct, form-fitting measures are preferred over other feasible measures, such as friction-fit, part linkings via cable pulls or the like, because of their simple and reliable construction.

For the same reason each of the other gradient sector portions can be provided with two abutment shoulders defining an open position and a closed position, respectively, of the respective gradient sector portion depending on the direction of rotation of the central shaft. In this case, preferably, one stationary stop pin only can be provided that cooperates with the abutment shoulders of the other gradient sector portions to serve as a stop in the open position and the closed position, respectively, of the respective gradient sector portion, so that advantageously a single stationary part limits the total range of movement of the gradient sector portions.

With respect to a quite compact and stiff design as well as good sealing options against loss of vacuum in the vacuum chamber it is further preferred if the substrate holder is drivingly connected to the dome rotary drive via a hollow shaft, wherein the central shaft for swivel-mounting of the gradient sector portions in the vacuum chamber extends through the hollow shaft, so that the central shaft and the hollow shaft are concentrically arranged about the axis of rotation.

In principle, the masking driving arrangement can be such that the gradient sector portions are rotated about the axis of rotation between the gradient mask open position and the gradient mask closed position by manually applying a torque to the central shaft, e.g., via a gear or lever mechanism. It is preferred, however, if the gradient sector portions are rotatable about the axis of rotation between the gradient mask open position and the gradient mask closed position by a masking rotary drive. This measure advantageously allows for automatic control of the masking arrangement via the control unit of the box coating apparatus. In this case, preferably, the masking rotary drive can be located outside of the vacuum chamber and drivingly connected to the central shaft within the vacuum chamber via a rotary feed through. This arrangement not only allows for easy servicing of the masking rotary drive but also is advantageous with respect to a low risk of vacuum contamination within the vacuum chamber. In principle, an electric motor can be used as the masking rotary drive. From a cost perspective in particular, however, it is preferred if the masking rotary drive is a pneumatic motor.

Advantageously, the gradient sector portions, at their free ends remote from the axis of rotation, can be provided with rollers which are arranged to roll on an assigned guiding rail upon rotation of the gradient sector portions about the axis of rotation. The guiding rail is affixed within and circumscribed by the vacuum chamber and circularly surrounds the axis of rotation, to support the gradient sector portions at their free ends against gravity. These measures provide for a quite stiff arrangement of the gradient sector portions and at the same time allow for a very smooth movement thereof. Nevertheless, the provision of slide bearings or the like to movably support the gradient sector portions at their free ends would be conceivable as well.

In principle, the gradient shields can be fixedly mounted on the gradient sector portions, or can be formed in one part therewith. The setup of the box coating apparatus for different coating purposes could then possibly require a complete replacement of the gradient sector portions. With respect to a higher degree of flexibility, however, it is preferred if the gradient shields are mounted to the gradient sector portions to be interchangeable. Alternatively, or in addition, the gradient shields can be mounted to the gradient sector portions to be adjustable with regard to their shadowing effect to provide for even greater flexibility.

In the latter case, finally, a very simple implementation can be such that mounting of the gradient shields to the gradient sector portions is carried out using screw members bolted to the one part which pass through oblong holes in the other part, so that the gradient shields can be adjusted with regard to their shadowing effect by laterally shifting the gradient shields along the oblong holes relative to the gradient sector portions prior to tightening the screw members.

BRIEF DESCRIPTION OF THE DRAWINGS

The invention is explained in more detail in the following by way of a preferred embodiment of a box coating apparatus for vacuum coating of substrates such as spectacle lens blanks with reference to the accompanying, partly simplified or schematic drawings. For simplification of the illustration, apart from parts of the cladding, walls and door of the box coating apparatus, the electron beam gun with shutter, the operating unit and control system (electrical cabinet), screens, handling devices and deposits for the substrates and consumables, the supply and conditioning devices—inclusive of lines, hoses and pipes—for current (transformers), compressed air, vacuum (high vacuum pump set) and cooling water (water thermo conditioner, cascade cooler, water chiller) as well as the measuring, maintenance and safety devices, in particular, were also mostly omitted from the drawings, in every instance to the extent that they are not required for understanding of the invention. These omitted parts, assemblies and devices, in structure and function, are known to the person skilled in the art anyway. In the drawings.

DETAILED DESCRIPTION OF THE PREFERRED EMBODIMENT

Figure 1:
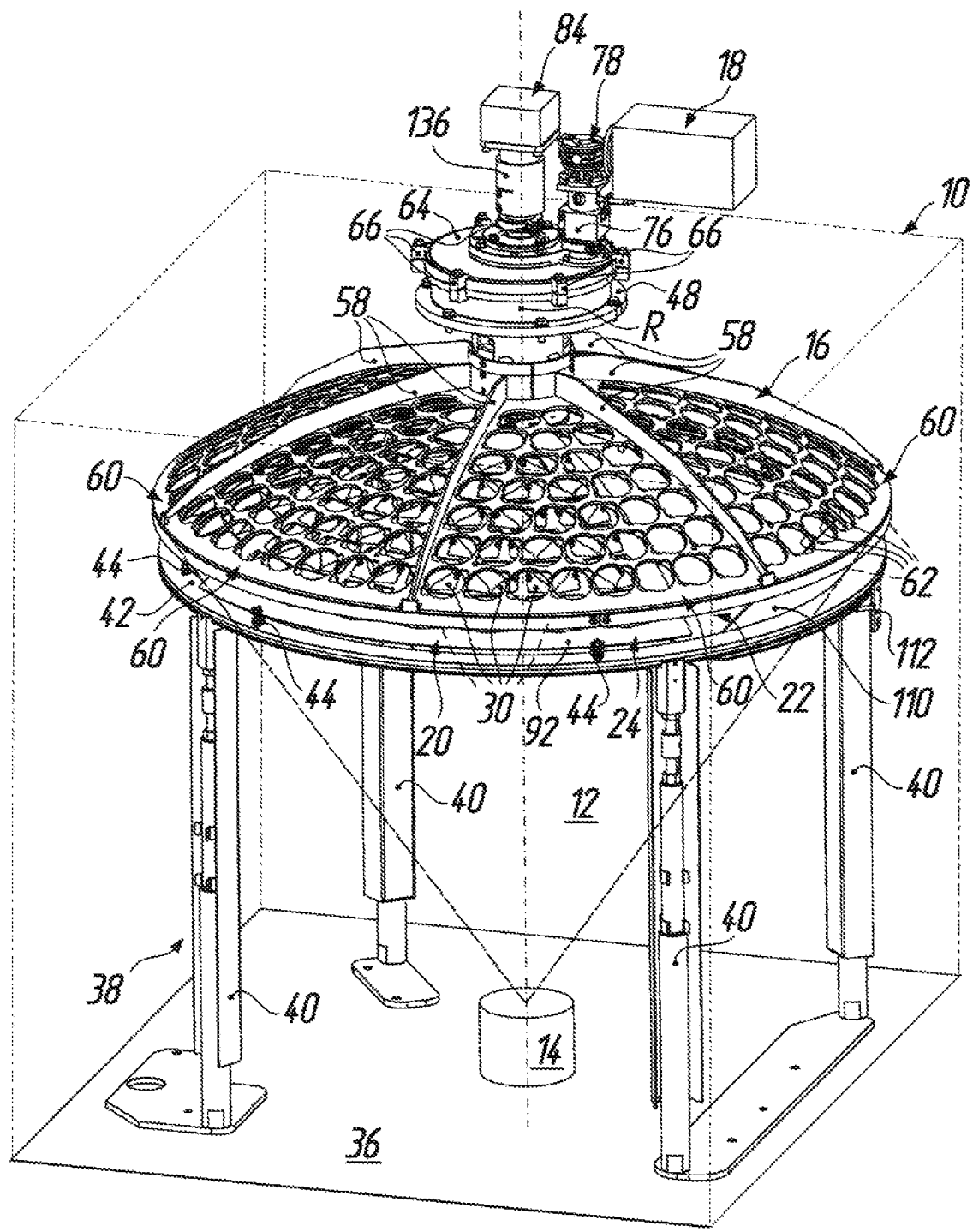
FIG. 1 shows a perspective view of a box coating apparatus according to the invention for, in particular, vacuum coating of spectacle lens blanks as substrates that are movably held by a dome shaped substrate holder about a central axis of rotation in a vacuum chamber, obliquely from above and front right, wherein a special masking arrangement is located in the vacuum chamber between an evaporation source and the substrate holder for selectively partially shadowing the substrates on the substrate holder relative to the evaporation source.
Figure 3:
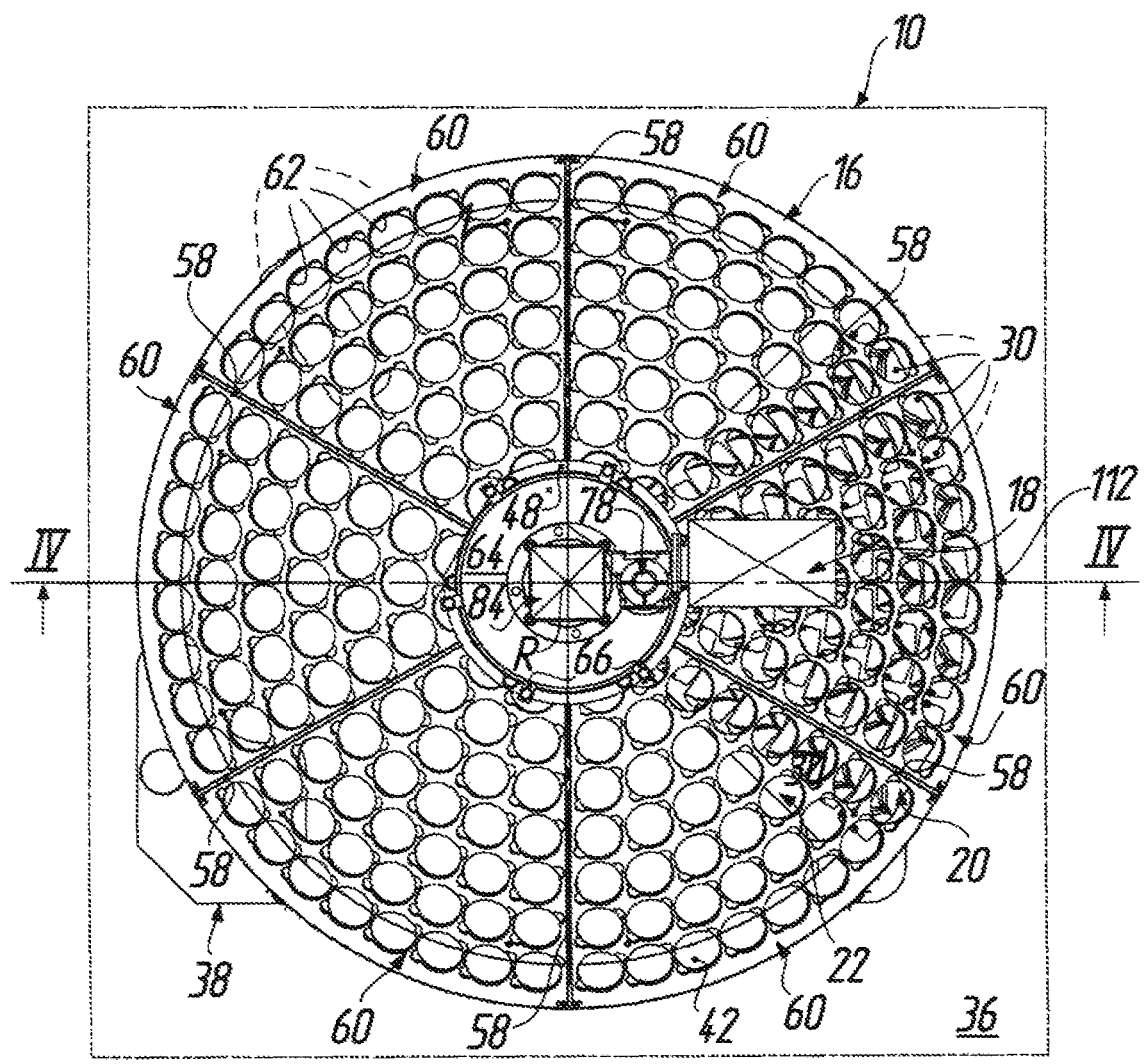
FIG. 3 shows a plan view of the box coating apparatus according to FIG. 1, from above in FIG. 1, wherein the gradient sector portions of the masking arrangement are situated in a gradient mask open position in which the gradient sector portions are stored behind a fixed masking portion of the masking arrangement.
Figure 4:
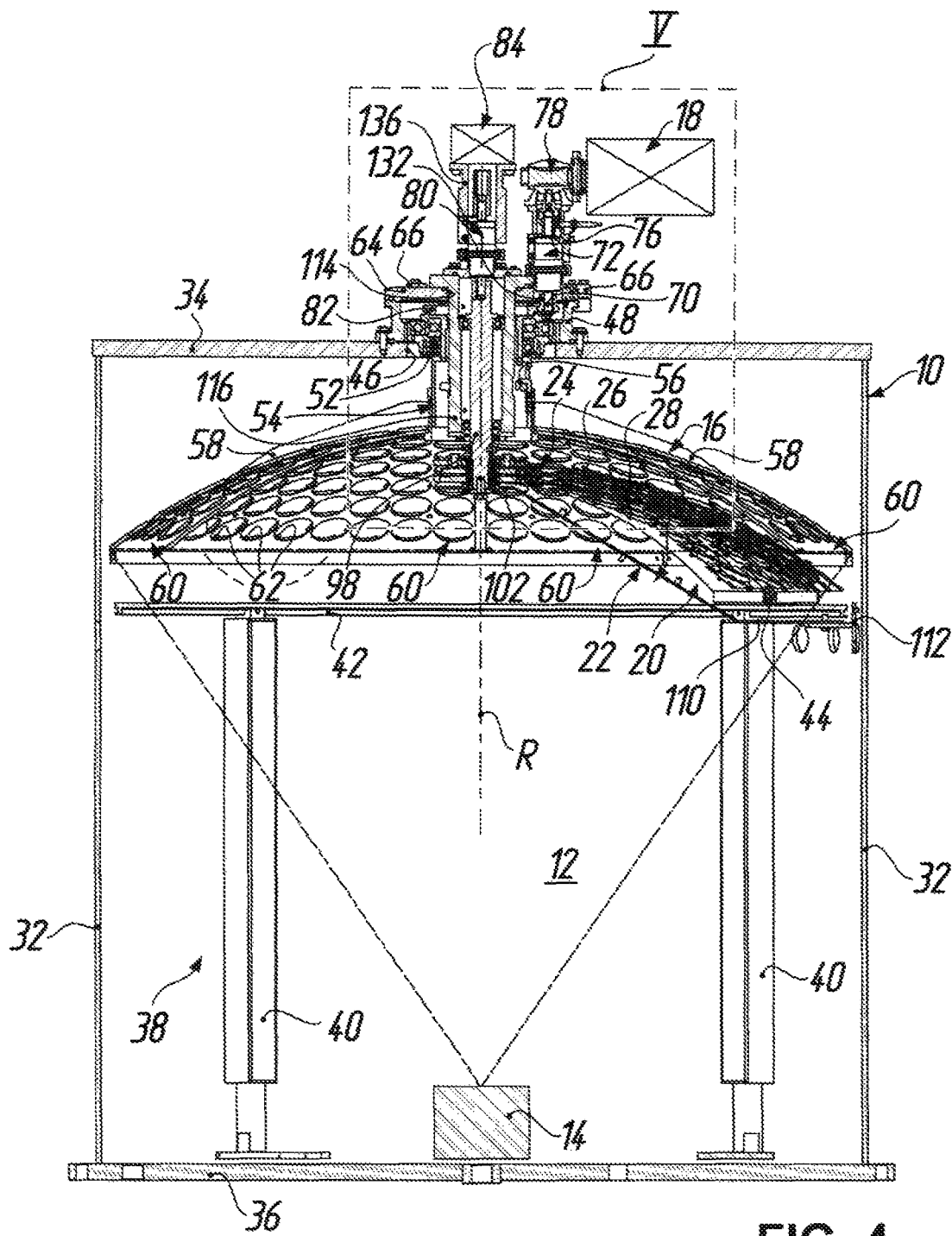
FIG. 4 shows a sectional view of the box coating apparatus according to FIG. 1 in correspondence with the section line IV-IV in FIG. 3.

A box coating apparatus for vacuum coating of substrates (not shown in the drawings), particularly spectacle lens blanks, is denoted by 10 in FIGS. 1, 3 and 4. The box coating apparatus 10 has a vacuum chamber 12 which contains an evaporation source 14 and a substrate holder 16 for holding a plurality of substrates. The substrate holder 16—in a manner as is known from, e.g., the box coating apparatus "1200-DLX box coater" available from the present applicant—is formed as a dome disposed vis-à-vis to the evaporation source 14 and rotatable by a dome rotary drive 18 about an axis of rotation R which passes through the evaporation source 14, so that substrates held by the substrate holder 16 in a known manner on a plurality of circles (in this example seven circles) can be moved on circular paths about the axis of rotation R with a respective constant spacing relative to the evaporation source 14. Further, a masking arrangement 20 is located in the vacuum chamber 12 between the evaporation source 14 and the substrate holder 16 for partially shadowing the substrates held by the substrate holder 16 relative to the evaporation source 14.

As will be explained in more detail, the masking arrangement 20 comprises a fixed masking portion 22 that is stationary in the vacuum chamber 12, and a plurality of—three in the illustrated embodiment—gradient sector portions 24, 26, 28 each carrying gradient shields 30 assigned to the substrates held by the substrate holder 16, for forming a gradient mask. The gradient sector portions 24, 26, 28—which in the illustrated embodiment are about the same size and shape—can be rotated about the axis of rotation R between a gradient mask open position (FIGS. 3, 4, 5, 7, 8, 14 A, 14 H, 15 A, 15 H, 16 A, 16 H) in which the gradient sector portions 24, 26, 28 are stored behind the fixed masking portion in a stacked arrangement, and a gradient mask closed position (FIGS. 1, 2, 9, 14 D, 14 E, 15 D, 15 E, 16 D, 16 E) in which the gradient sector portions 24, 26, 28 are spread like a fan between the evaporation source 14 and the substrate holder 16.

Figure 2:
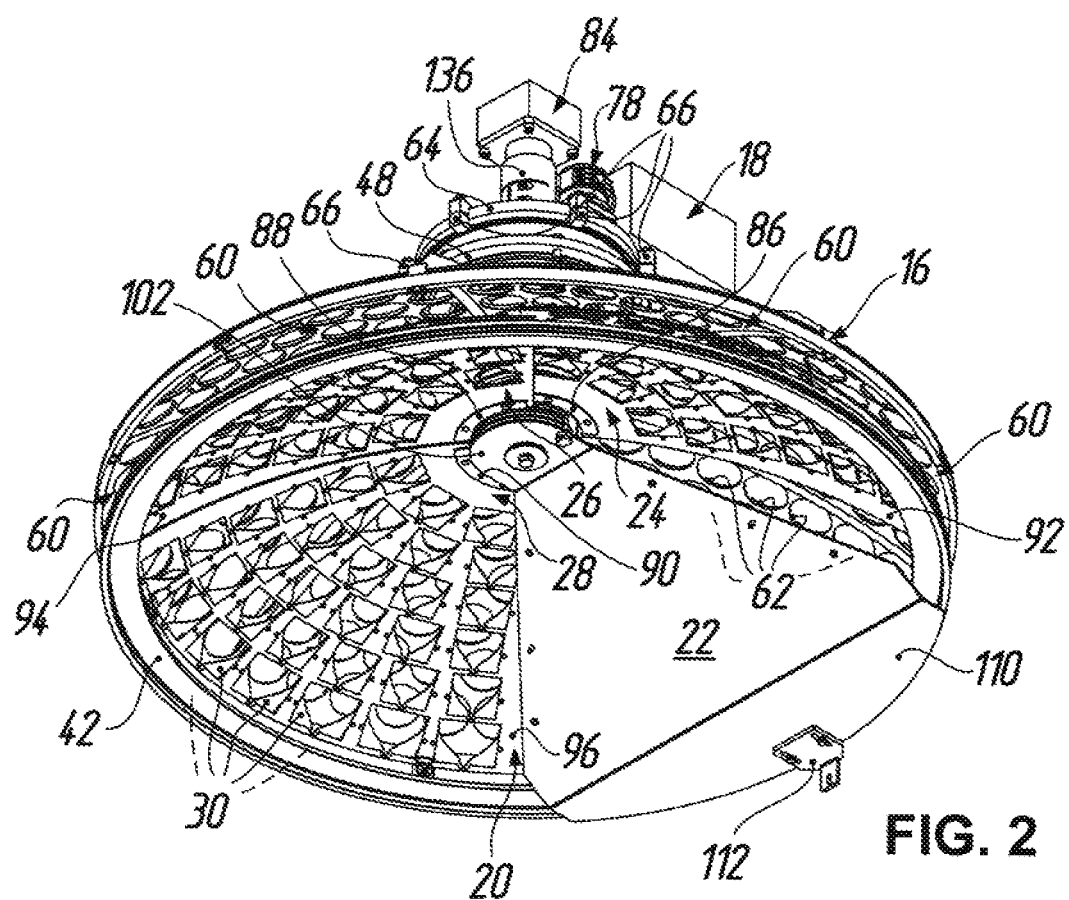
FIG. 2 shows a perspective view of the dome shaped substrate holder and the assigned masking arrangement, inclusive of the associated rotary drive assemblies, of the box coating apparatus according to FIG. 1, isolated therefrom and obliquely from below and laterally from the left, wherein gradient sector portions of the masking arrangement are situated in a gradient mask closed position in which the gradient sector portions are spread like a fan so as to provide a defined screen between the evaporation source and the substrate holder of the box coating apparatus.

As can be taken from FIG. 4 that also shows walls of the box coating apparatus 10 omitted in FIGS. 1 to 3 to allow a free view to the inside of the vacuum chamber 12, the vacuum chamber 12 is bounded by side walls 32, a top wall 34 and a bottom wall 36. The evaporation source 14 is suitably mounted at a central location on the bottom wall 36. The bottom wall 36 also bears a support structure 38 assigned to the masking arrangement 20. According to FIGS. 1 and 4 the support structure 38 has four posts 40 that can be adjusted in length, and are uniformly distributed around the axis of rotation R so as to stationary and horizontally mount a guiding rail 42 (cf. FIGS. 10 and 11) circularly surrounding the axis of rotation R and forming a circular horizontal path in the vacuum chamber 12. The guiding rail 42 serves to support the gradient sector portions 24, 26, 28 at their free ends remote from the axis of rotation R against gravity. For this purpose the gradient sector portions 24, 26, 28, at their free ends, are each provided with two rollers 44 which are spaced apart from each other in the circumferential direction. The rollers 44 are assigned to and arranged to roll on the guiding rail 42 upon rotation of the gradient sector portions 24, 26, 28 about the axis of rotation R.

Further details of the dome shaped substrate holder 16, its support in the box coating apparatus 10 and driving arrangement, including the dome rotary drive 18, can be taken from FIGS. 4 to 7 in particular. The top wall 34 of the box coating apparatus 10 is provided at 46 with a central opening of circular shape, through which the driving arrangement for the substrate holder 16 extends into the vacuum chamber 12. A ring shaped bearing flange 48 is fixedly mounted on top of the top wall 34 to be aligned with the central opening 46 on the axis of rotation R. At the inner circumference the bearing flange 48, together with a retaining ring 50 (see FIG. 6), supports an axial and radial bearing arrangement 52 for the substrate holder 16. As can best be seen in FIGS. 6 and 7 the axial and radial bearing arrangement 52 supports a hollow shaft 54 of two-part construction, to which the substrate holder 16 is hooked via brackets 56, so that the substrate holder 16 can rotate together with the hollow shaft 54 about the axis of rotation R and at the same time is axially supported against gravity. The substrate holder 16 as such comprises arched holding arms 58 which spider-like extend from the hollow shaft 54 at regular intervals about the axis of rotation R (see FIGS. 1 and 3), to removably hold sheet-like, vaulted holding segments 60 of same size and shape. Each holding segment 60 has a plurality of substantially circular apertures 62 to which the substrates can be fitted from above in a manner known per se.

The substrate holder 16 is drivingly connected to the dome rotary drive 18 via the hollow shaft 54 as will be explained in the following. According to FIGS. 4 to 6 a flat supporting plate 64 is fixedly mounted on top of the bearing flange 48 by a plurality of brackets 66. The supporting plate 64 is provided, on the right hand side in FIGS. 4 to 6, with an opening 68 through which a driving shaft 70 of a rotary feed through 72 extends. The rotary feed through 72 is mounted to the supporting plate 64 by a mounting flange 74 to be centered with respect to the opening 68. Further, an intermediate part 76 is mounted to an upper end of the rotary feed through 72, for holding an angular gear 78 at the top of the intermediate part 76. At the right hand side of the angular gear 78 in FIGS. 4 and 5 the dome rotary drive 18 is flange-mounted to the angular gear 78. Accordingly, the dome rotary drive 18 is fixed with respect to the top wall 34 of the box coating apparatus 10 via a housing of the angular gear 78, the intermediate part 76, a housing of the rotary feed through 72, the mounting flange 74, the supporting plate 64 and the bearing flange 48.

On the driving shaft 70 extending through the opening 68 of the supporting plate 64 a pinion 80 is mounted to be capable of rotating together with the driving shaft 70. The pinion 80 meshes with a gear wheel 82 mounted on top of the hollow shaft 54 to be capable of rotating together with the hollow shaft 54. As is evident from the foregoing description, the hollow shaft 54—and thus the substrate holder 16—can be driven to rotate about the axis of rotation R via the electric dome rotary drive 18, the angular gear 78, the driving shaft 70 of the rotary feed through 72, the pinion 80 attached thereto and the gear wheel 82 arranged on the hollow shaft 54.

Next it will be explained how—in the illustrated embodiment—the gradient sector portions 24, 26, 28 are built up and rotatable about the axis of rotation R between the gradient mask open position and the gradient mask closed position by a masking rotary drive 84 which preferably is a pneumatic motor. Each gradient sector portion 24, 26, 28 has a central hub section 86, 88, 90 and a sheet-like, vaulted circle segment 92, 94, 96 of about 90 degrees segment angle, which is attached, at the narrow side thereof, to the respective hub section 86, 88, 90 via two fasteners (cf. FIGS. 2, 7 and 9 in particular) and provided with a plurality of the gradient shields 30 as will be explained later. The circle segments 92, 94, 96, in the gradient mask closed position of the gradient sector portions 24, 26, 28, create a partial dome shape having a parallel contour to the dome shape of the substrate holder 16 but located in substantially parallel offset relative to the dome shape of the substrate holder 16, as can be seen in FIGS. 1 and 2.

Further, as can be taken from FIGS. 4 to 7 in the first instance, the gradient sector portions 24, 26, 28 are swivel-mounted in the vacuum chamber 12 by a common central shaft 98 aligned with the axis of rotation R. To be more precise, according to FIGS. 5 and 7 each of the hub sections 86, 88, 90 of the gradient sector portions 24, 26, 28, at the respective inner circumference, is radially supported on the outer circumference of a lower end of the central shaft 98 by a rolling bearing 100. Another rolling bearing 100 is provided between a bent central end section 102 of the fixed masking portion 22 and the lower end of the central shaft 98. According to FIG. 7, spacer rings 104 axially interposed between the rolling bearings 100 together with an end washer 106 that is bolted to the lower end face of the central shaft 98 by a central screw 108, axially hold this bearing arrangement in place. At the same time the central end section 102 of the fixed masking portion 22 is axially supported on the central shaft 98. A bent outer end section 110 of the fixed masking portion 22, which generally has a regular triangle form as seen in a plan view (cf. FIGS. 8 and 9) and is made from a sheet material, is fixed to and axially supported by the side wall 32 of the box coating apparatus 10 via a bracket 112 (see FIG. 4).

The central shaft 98 is supported to be axially fixed but rotatable relative to the top wall 34 of the box coating apparatus 10. To this end, according to FIGS. 4 to 6, the supporting plate 64 is provided with a central opening 114 of circular shape. A bearing sleeve 116 is flange mounted to the supporting plate 64 from the top to extend through the central opening 114 of the supporting plate 64, the gear wheel 82, the hollow shaft 54 and the central opening 46 of the top wall 34 until it ends approximately at the lower end of the hollow shaft 54 (cf. FIG. 7). The central shaft 98 is rotatably mounted inside the bearing sleeve 116 by a bearing arrangement which comprises an upper locating rolling bearing 118 and a lower floating rolling bearing 120. While a ring part 122 (see FIGS. 5 and 7) mounted to the lower end of the bearing sleeve 116 axially supports the floating rolling bearing 120, the locating rolling bearing 118 is axially held in place by a shoulder 124 and a retaining ring 126 (cf. FIG. 6) at the inner circumference of the bearing sleeve 116.

Figure 6:
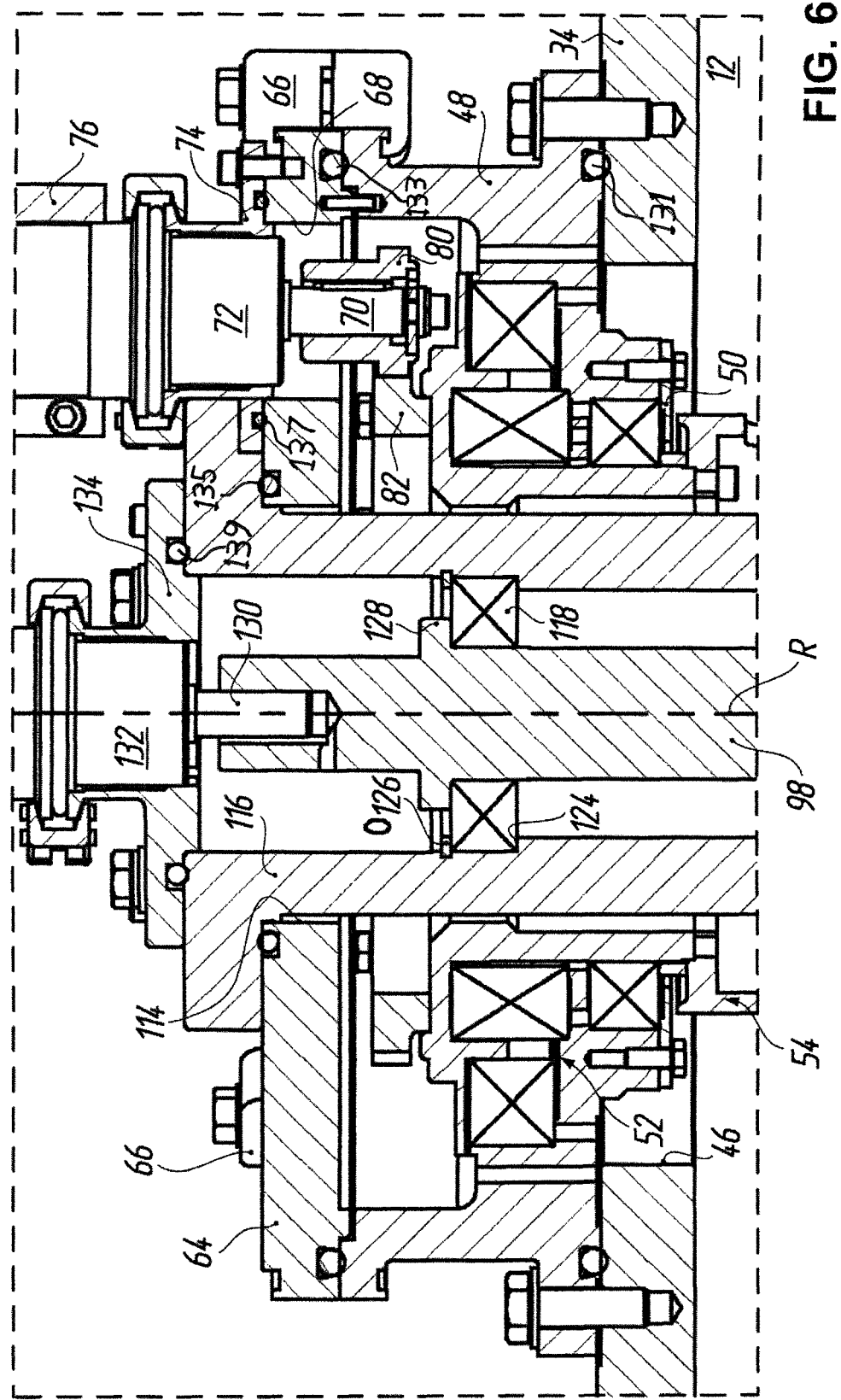
FIG. 6 shows a part sectional view, to a further enlarged scale, of the box coating apparatus according to FIG. 1 in correspondence with the detail VI in FIG. 5, for further illustration of the rotary drive assemblies provided for the substrate holder and the masking arrangement.
Figure 7:
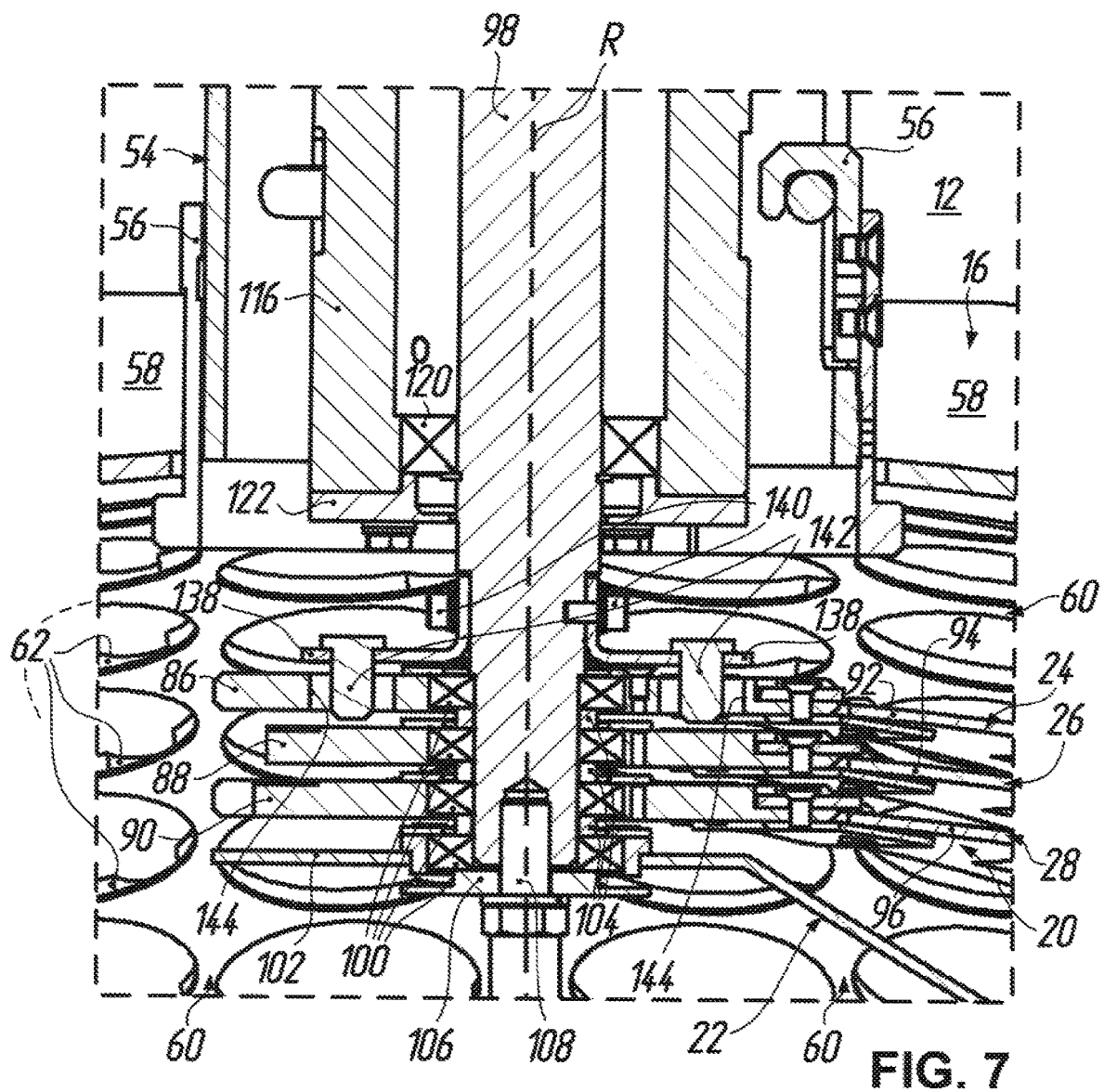
FIG. 7 shows a part sectional view, in the scale of FIG. 6, of the box coating apparatus according to FIG. 1 in correspondence with the detail VII in FIG. 5, further illustrating how the gradient sector portions of the masking arrangement are rotatably attached to a central shaft of the rotary drive assembly provided for the masking arrangement.
Figure 8:
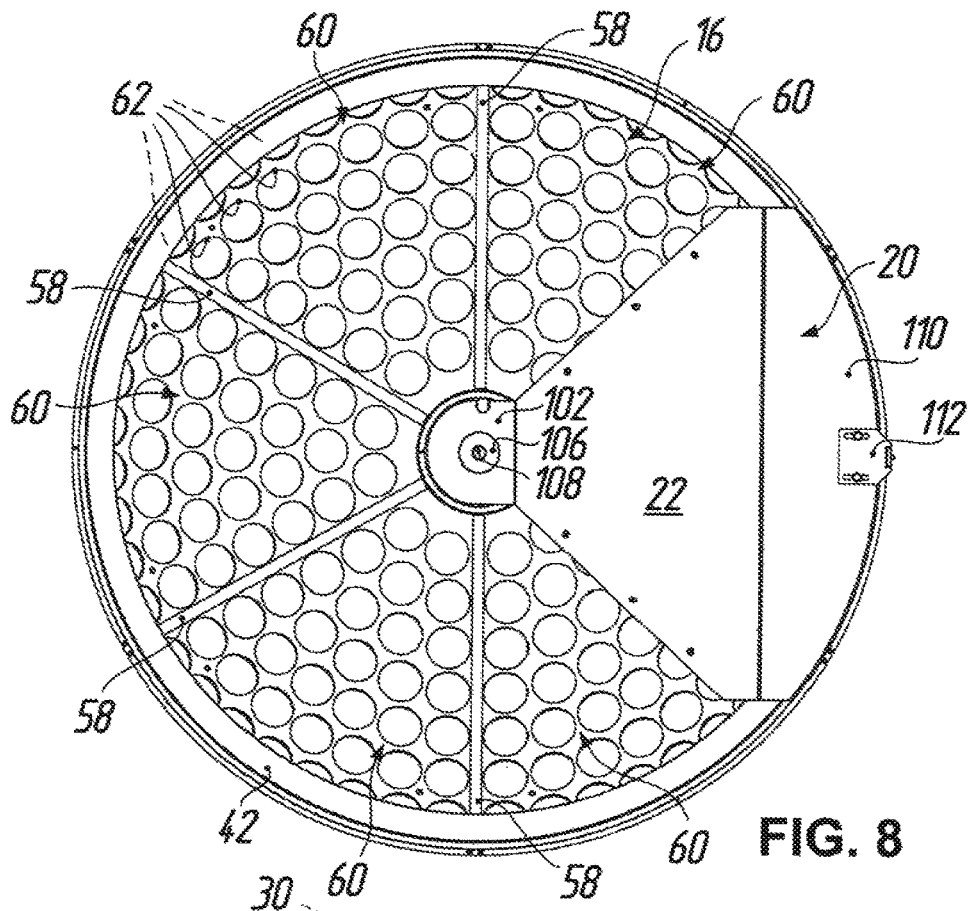
FIG. 8 shows a bottom view of the substrate holder and the masking arrangement, with the associated rotary drive assemblies being omitted for the sake of clarity, of the box coating apparatus according to FIG. 1, from below in FIG. 2, wherein the gradient sector portions are situated in the gradient mask open position, i.e. stored behind the fixed masking portion of the masking arrangement on the right in FIG. 8.
Figure 9:
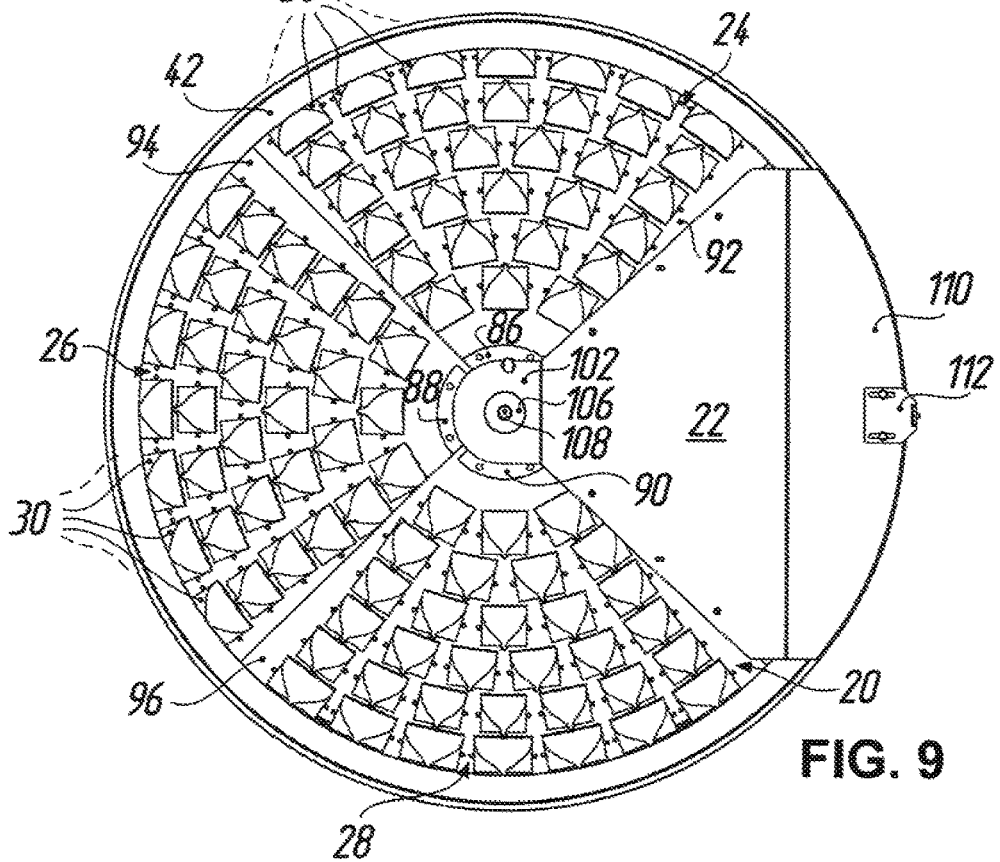
FIG. 9 shows a bottom view of the masking arrangement, with the substrate holder and the associated rotary drive assemblies being omitted for the sake of clarity, of the box coating apparatus according to FIG. 1, from below in FIG. 2, wherein the gradient sector portions are situated in the gradient mask closed position, i.e. spread like a hand fan about the central axis of rotation.

Further, according to FIG. 6, the central shaft 98 axially rests on the locating rolling bearing 118 via an annular collar 128 of the central shaft 98.

Figure 5:
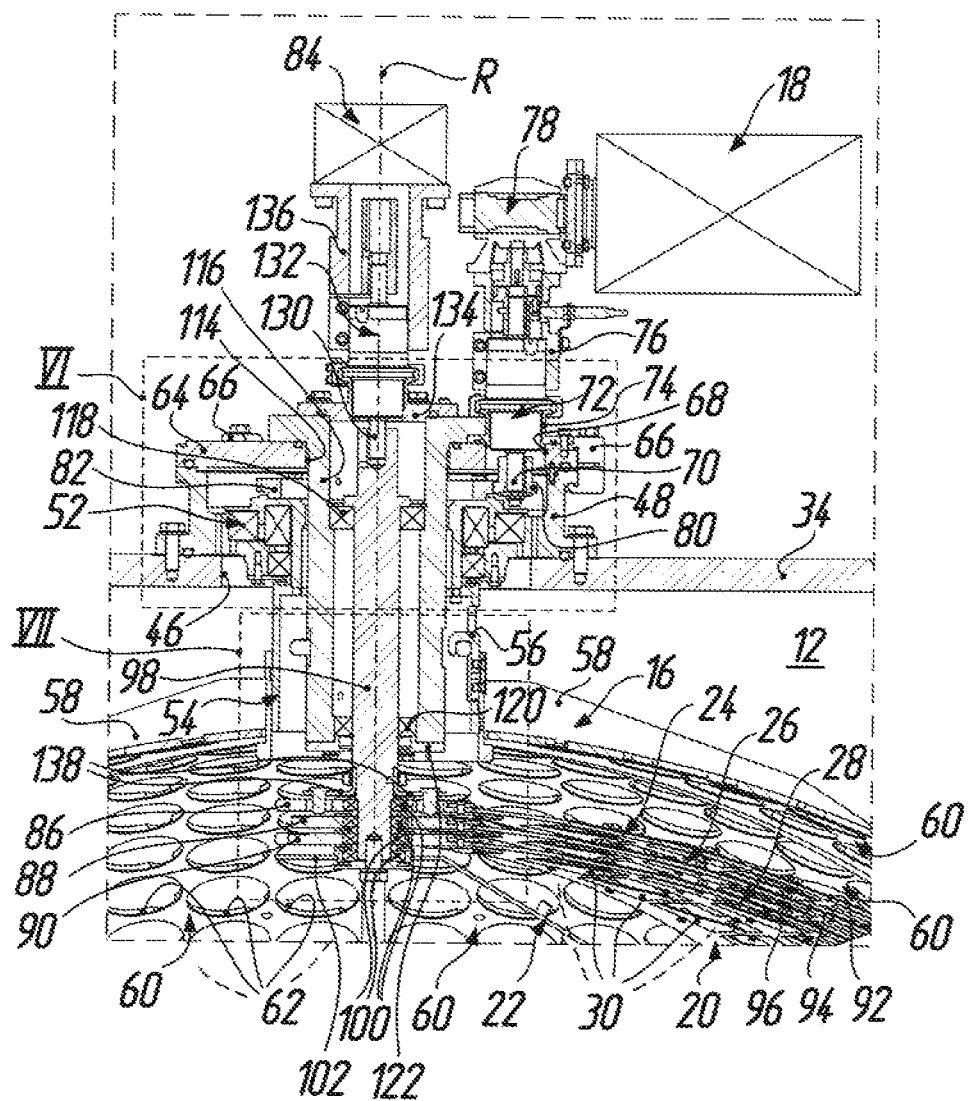
FIG. 5 shows a part sectional view, to an enlarged scale, of the box coating apparatus according to FIG. 1 in correspondence with the detail V in FIG. 4, for better illustration of the rotary drive assemblies provided for the substrate holder and the masking arrangement.

As can be taken from FIGS. 4 to 6, a driving shaft 130 of a further rotary feed through 132 extends into the bearing sleeve 116 and is fixedly connected to the upper end of the central shaft 98 there. The rotary feed through 132 is mounted to the bearing sleeve 116 by a mounting flange 134 to be centered with respect to the bearing sleeve 116. Further, according to FIGS. 4 and 5, an intermediate part 136 is mounted to an upper end of the rotary feed through 132, for holding the masking rotary drive 84 which is flange-mounted to the top of the intermediate part 136 and drivingly connected to the upper end of the driving shaft 130 of the rotary feed through 132. Accordingly, the masking rotary drive 84 as well is fixed with respect to the top wall 34 of the box coating apparatus 10 via the intermediate part 136, a housing of the rotary feed through 132, the mounting flange 134, the bearing sleeve 116, the supporting plate 64 and the bearing flange 48. As is further evident from the foregoing description, the central shaft 98 can be driven to rotate about the axis of rotation R—either in the clockwise direction or the counterclockwise direction—via the pneumatic masking rotary drive 84 and the driving shaft 130 of the rotary feed through 132. In doing so the central shaft 98 for swivel-mounting of the gradient sector portions 24, 26, 28 in the vacuum chamber 12 extends through the hollow shaft 54 that drivingly connects the substrate holder 16 to the dome rotary drive 18, so that the central shaft 98 and the hollow shaft 54 are concentrically arranged about the axis of rotation R. In this context it is to be noted that a) several sealing rings 131, 133, 135, 137 and 139 shown in FIG. 6 between the mounted parts and top wall 34, b) the rotary feed through 132 assigned to the masking arrangement 20 by drivingly connecting the central shaft 98 within the vacuum chamber 12 to the masking rotary drive 84 located outside of the vacuum chamber 12, and c) the rotary feed through 72 assigned to the substrate holder 16, together prevent ambient air from entering the vacuum chamber 12 via the central opening 46 in the top wall 34.

As will be explained in the following, a first, i.e. the upper one 24 of the gradient sector portions is connected to rotate with the central shaft 98, whereas the other gradient sector portions 26, 28 are mounted on the central shaft 98 by the rolling bearings 100 to be pivotable with respect to the central shaft 98, wherein the other gradient sector portions 26, 28 further are adapted to be taken along by the first gradient sector portion 24 in a successive manner upon rotation thereof with the central shaft 98 so as to either close or open the gradient mask depending on the direction of rotation of the central shaft 98. To this end, according to FIG. 7 in particular, the central shaft 98 is drivingly connected to the hub section 86 of the gradient sector portion 24 on opposing sides of the central shaft 98 by angle brackets 138 and suitable fasteners 140, 142 that are fixed to the central shaft 98 and engage into assigned elongated towing holes 144 of the hub section 86, respectively. Further, adjacent gradient sector portions 24, 26, 28 in each case comprise cooperating driving projections which are arranged to successively come into engagement with each other upon rotation of the central shaft 98.

Figure 15:
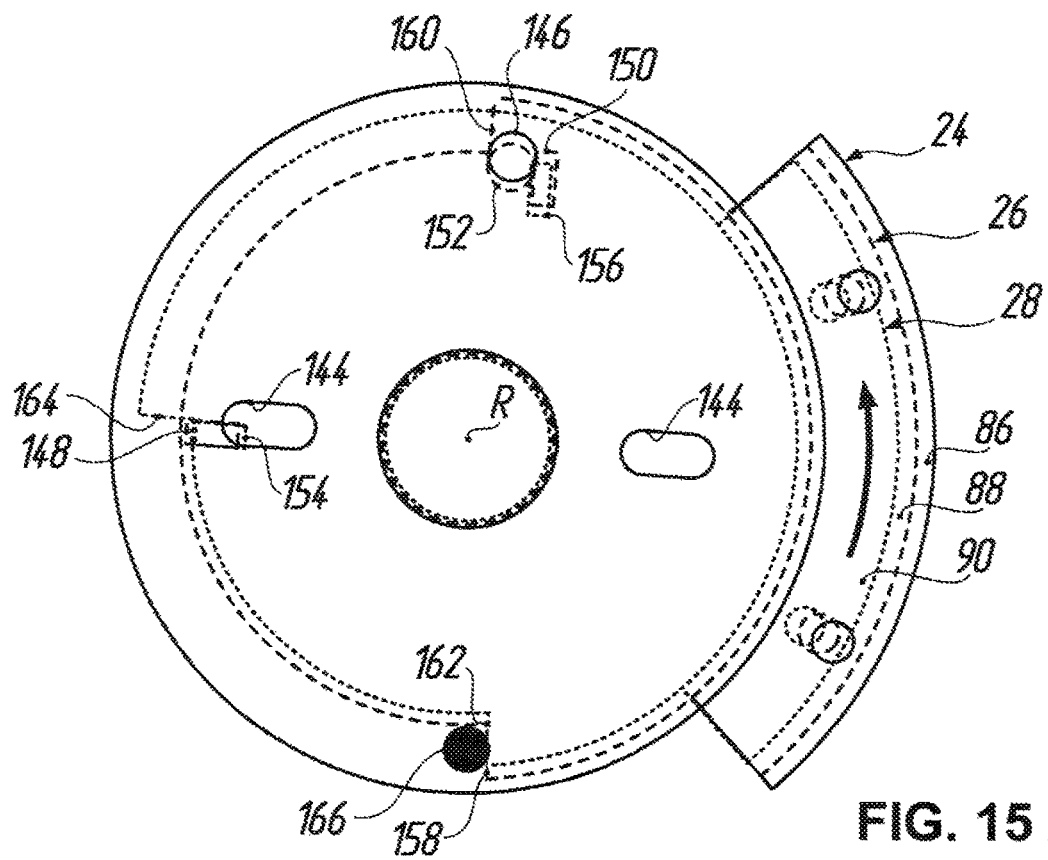
FIG. 15 A to FIG. 15 H show, in a schematic and transparent form, top views of stacked hub sections of the three gradient sector portions according to FIGS. 14 A to 14 H, with the top hub section being represented in solid lines, the middle hub section in dashed lines, and the undermost hub section in dotted lines, and with the radial dimensions being varied as well from hub section to hub section for the sake of clarity only, for further illustration of the closing and opening motion sequences, respectively, corresponding to FIGS. 14 A to 14 H, wherein these diagrammatic top views particularly illustrate how driving projections and abutment shoulders provided on the hub sections interact together and with a stationary stop pin, respectively, so that the lower gradient sector portions are taken along by the upper gradient sector portion in a successive manner upon rotation thereof from the gradient mask open position to the gradient mask closed position (FIGS. 15 A to 15 D) and vice versa (FIGS. 15 E to 15 H)
Figure 15:
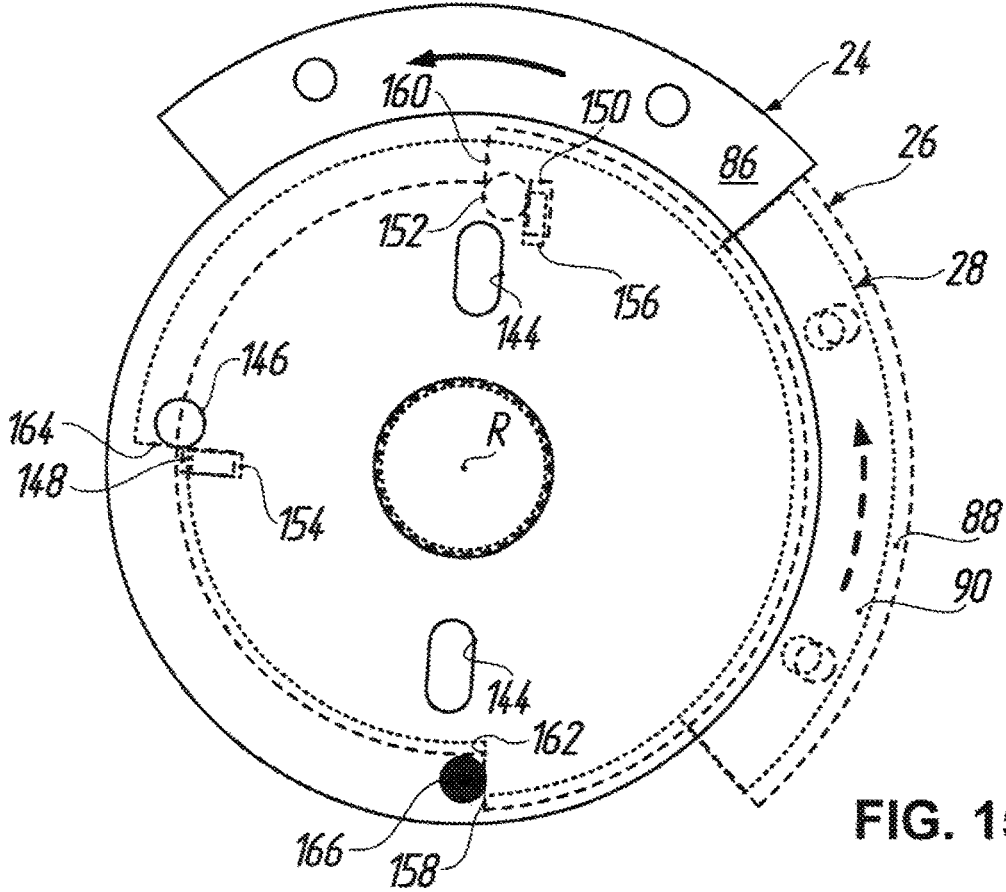
Figure 15:
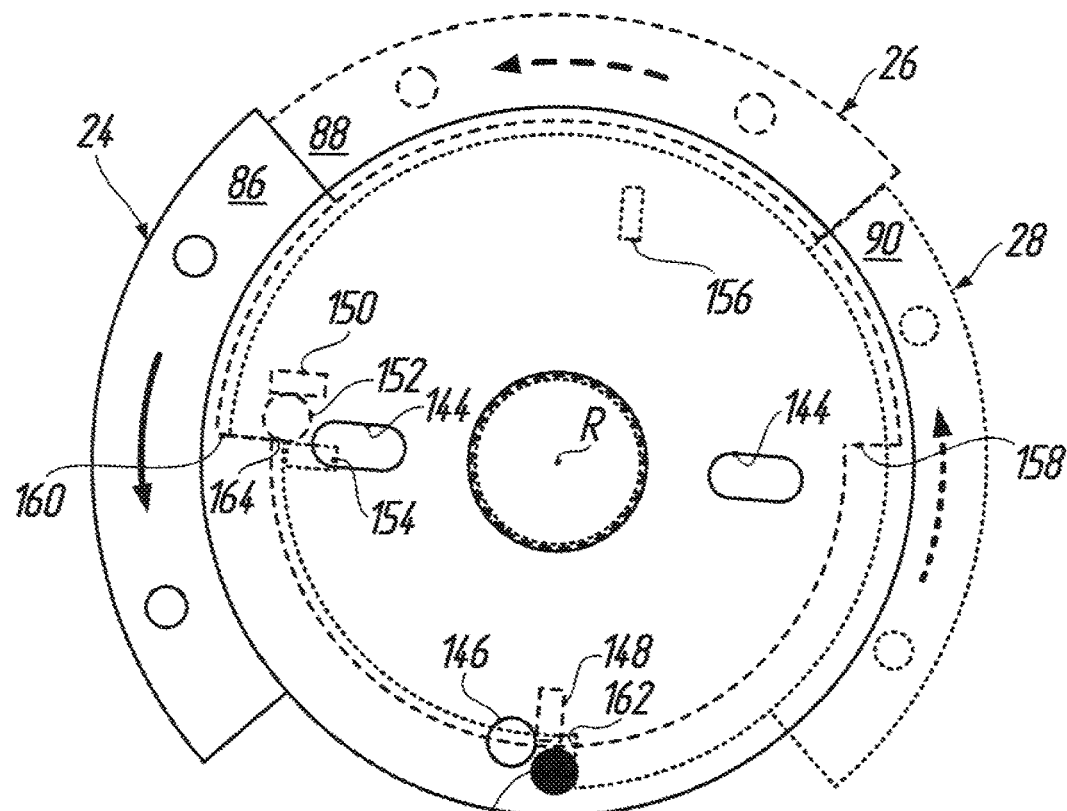
Figure 15:
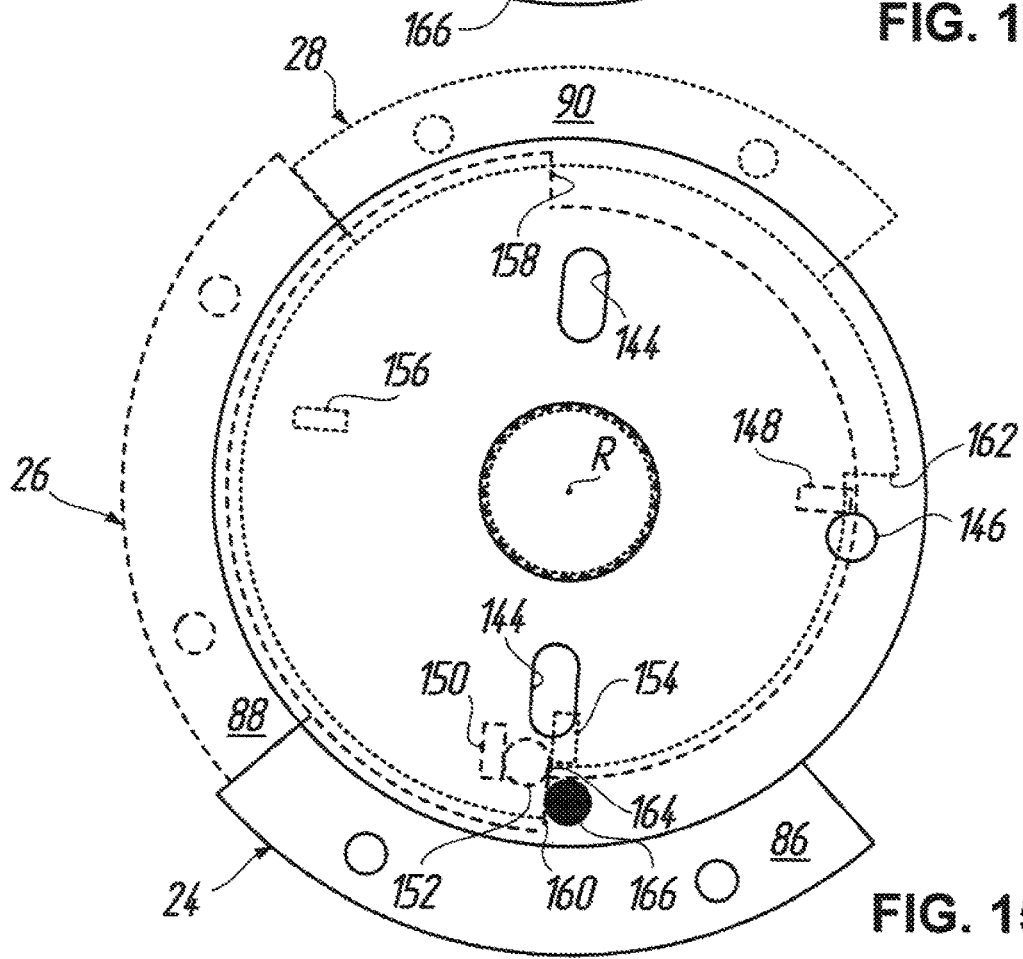
Figure 15:
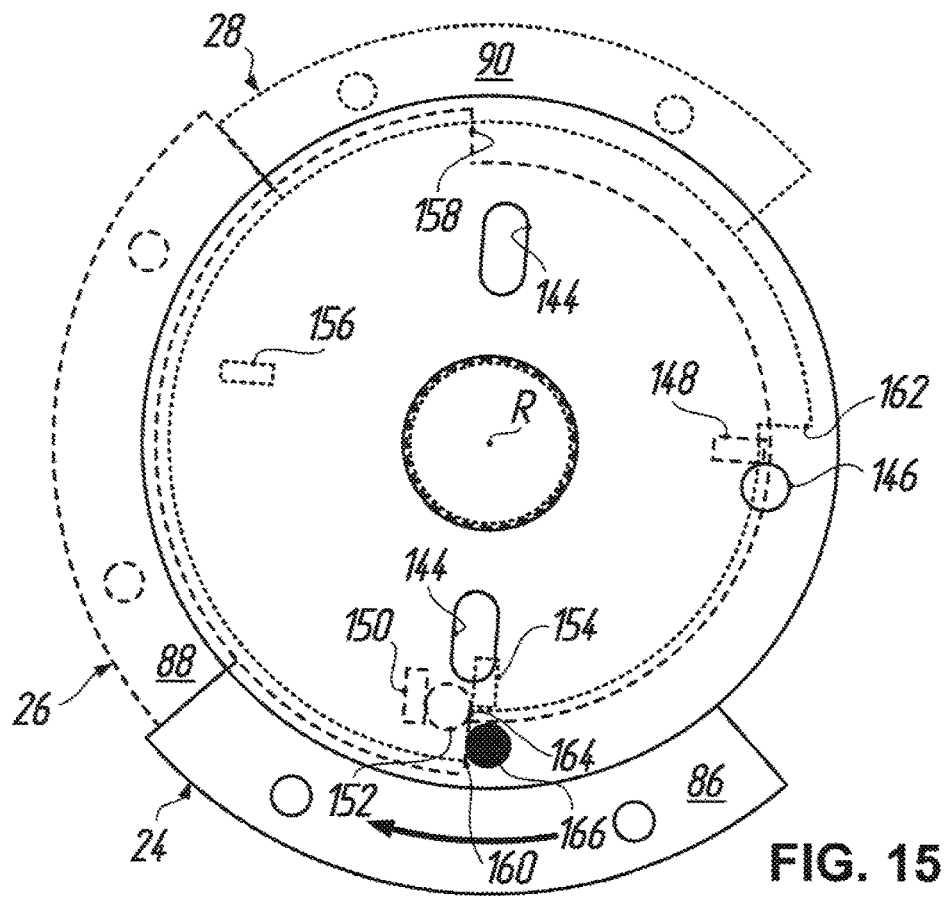
Figure 15:
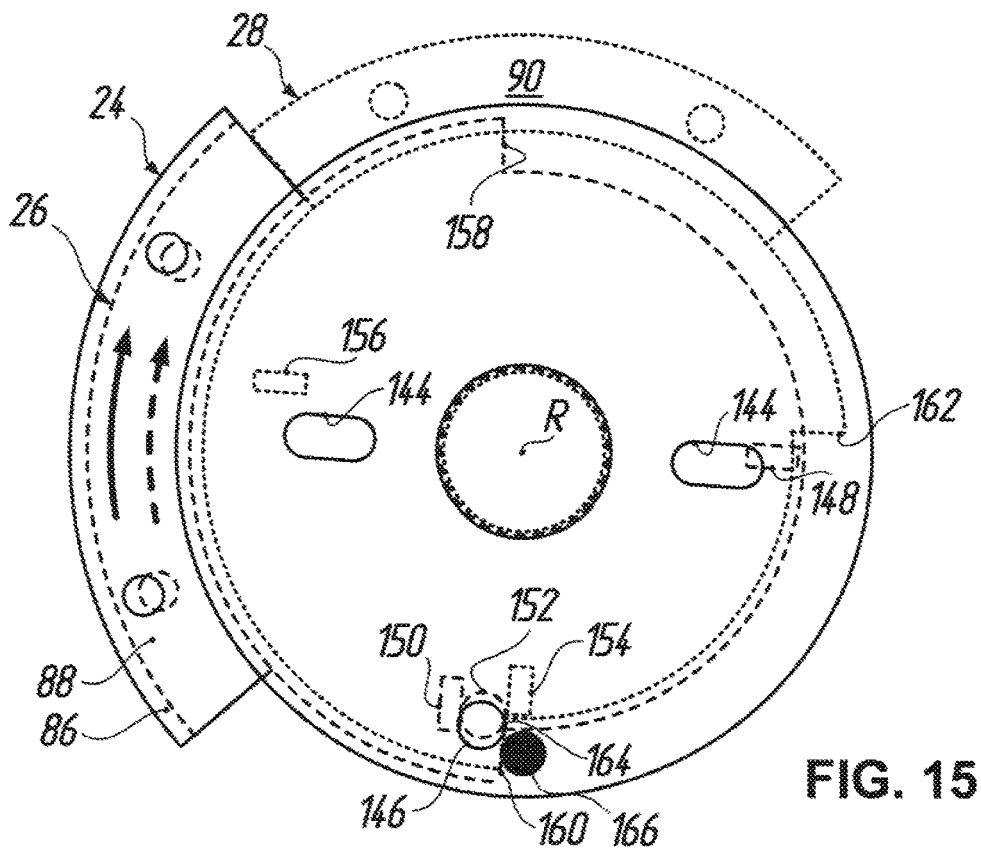
Figure 15:
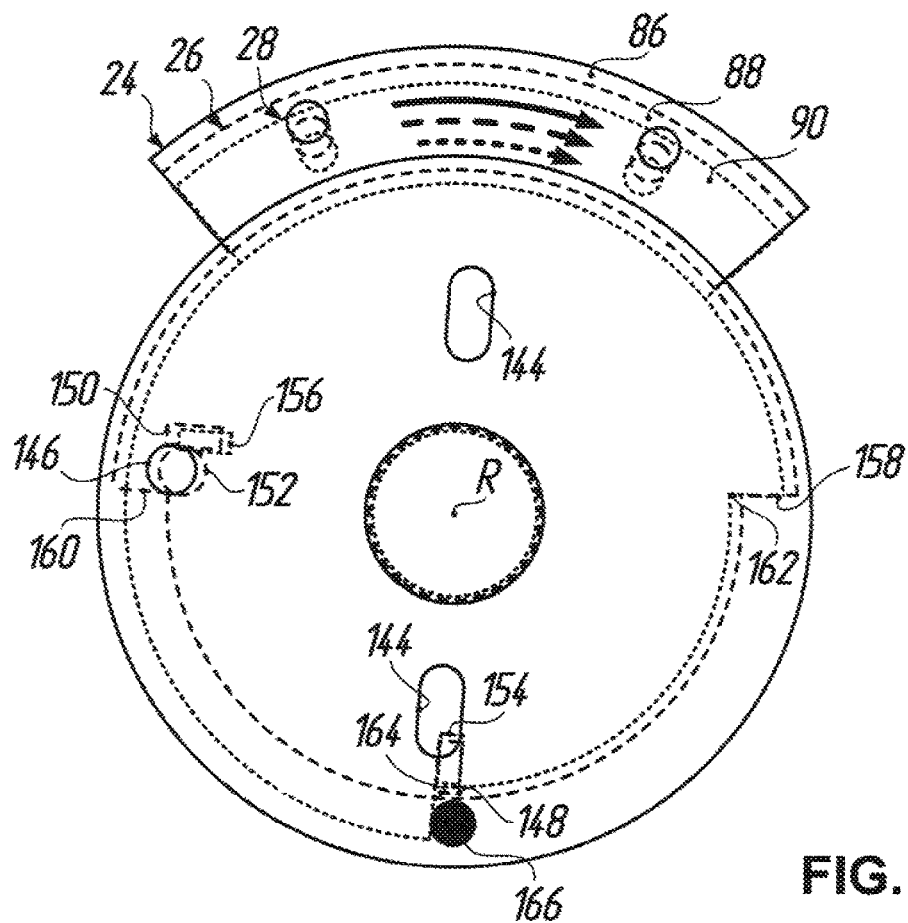
Figure 15:
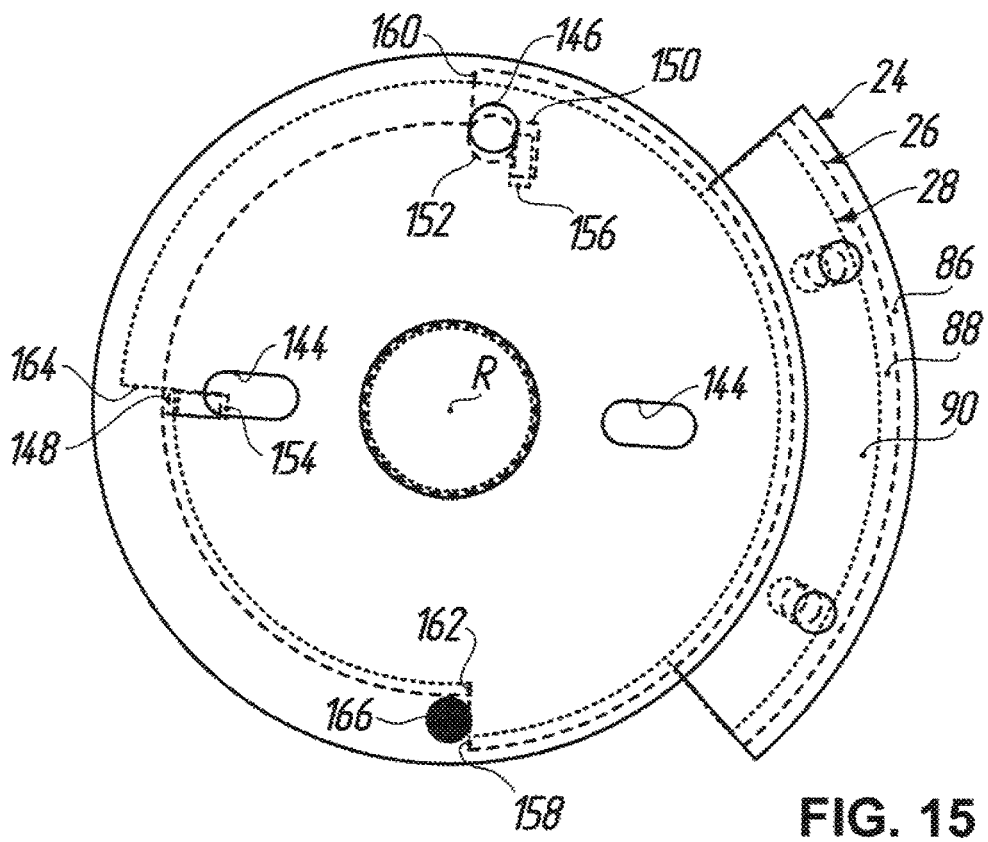

To be more precise, according to FIGS. 15 A to 16 H, the hub section 86 of the upper gradient sector portion 24 comprises an engagement pin 146 as driving projection that protrudes from the lower side of the hub section 86 and is positioned to cooperate, depending on the direction of rotation of the hub section 86, with either one of two keys 148, 150 that are attached to and protrude from the upper side of the hub section 88 of the middle gradient sector portion 26 as driving projections which are spaced apart by an angle of about 100 degrees with respect to the axis of rotation R. Likewise the hub section 88 of the middle gradient sector portion 26 has an engagement pin 152 as driving projection that protrudes from the lower side of the hub section 88 and is positioned to cooperate, depending on the direction of rotation of the hub section 88, with either one of two keys 154, 156 that are attached to and protrude from the upper side of the hub section 90 of the undermost gradient sector portion 28, again as driving projections which are spaced apart by an angle of about 100 degrees with respect to the axis of rotation R.

As can further be taken from FIGS. 15 A to 15 H in particular, each of the other gradient sector portions 26, 28 is provided with two abutment shoulders 158, 160, 162, 164 defining an open position and a closed position, respectively, of the respective gradient sector portion 26, 28 depending on the direction of rotation of the central shaft 98. While the abutment shoulders 158, 160 of the middle hub section 88 of the gradient sector portion 26 are spaced apart by an angle of about 187 degrees with respect to the axis of rotation R, the abutment shoulders 162, 164 of the undermost hub section 90 of the gradient sector portion 28 are spaced apart by an angle of about 97 degrees with respect to the axis of rotation R. As is further evident from FIGS. 15 A to 16 H, one stationary stop pin 166 only is provided that is arranged to cooperate with the abutment shoulders 158, 160, 162, 164 of the other gradient sector portions 26, 28 to serve as a stop in the open position and the closed position, respectively, of the respective gradient sector portions 26, 28. The stop pin 166 is fixedly attached to the central end section 102 of the fixed masking portion 22.

Figure 14:
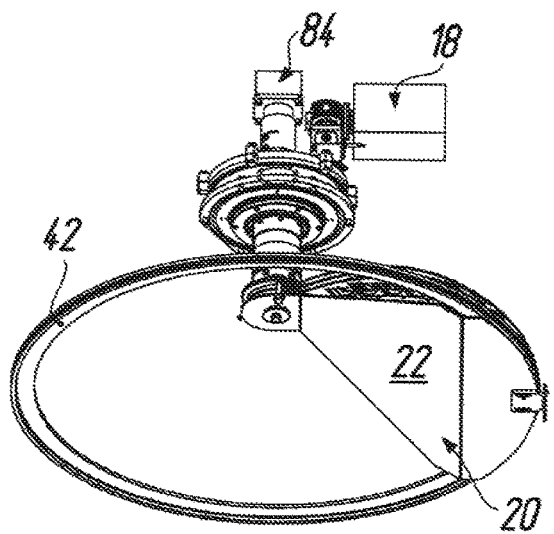
FIG. 14 A to FIG. 14 H show perspective views of the masking arrangement, inclusive of the rotary drive assemblies but with the substrate holder being omitted for the sake of clarity, of the box coating apparatus according to FIG. 1, isolated therefrom and obliquely from below, illustrating the closing and opening motion sequences, respectively, of the three gradient sector portions of the masking arrangement from the gradient mask open position to the gradient mask closed position (FIGS. 14 A to 14 D) and vice versa (FIGS. 14 E to 14 H)
Figure 14:
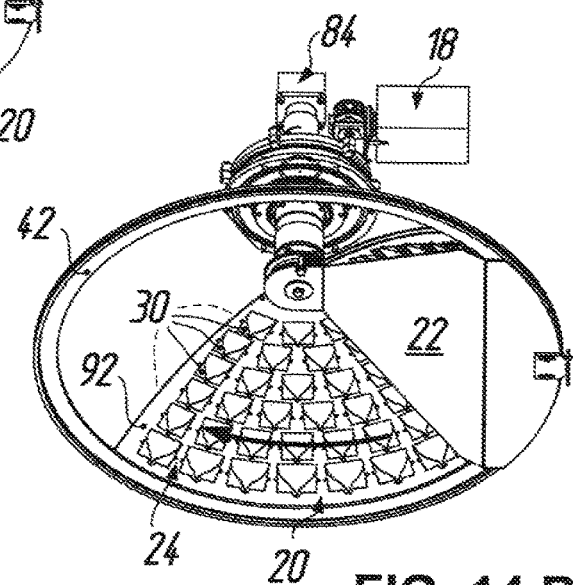
Figure 14:
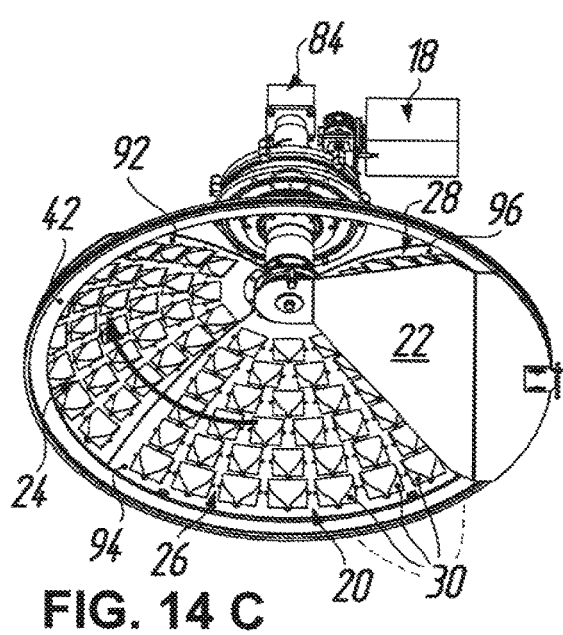
Figure 14:
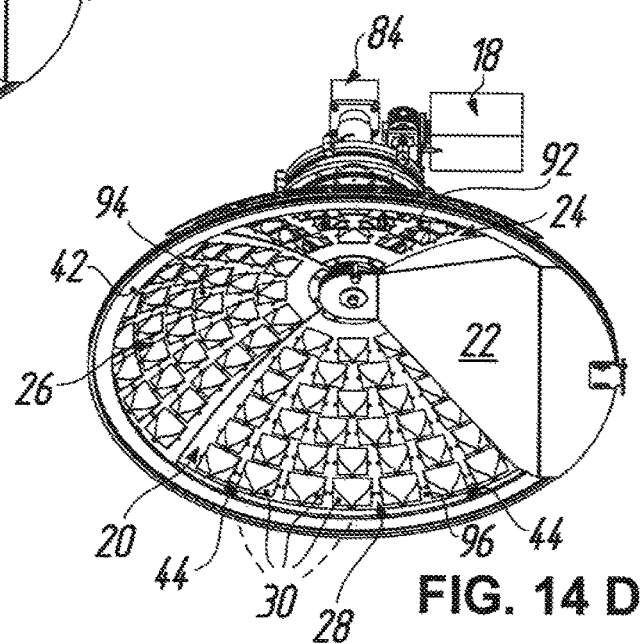
Figure 14:
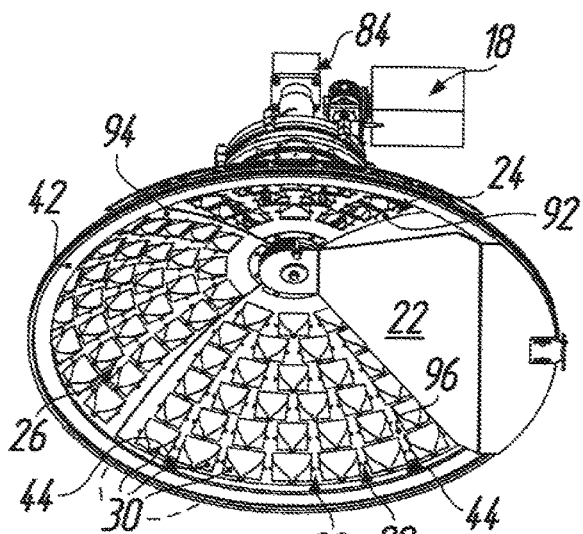
Figure 14:
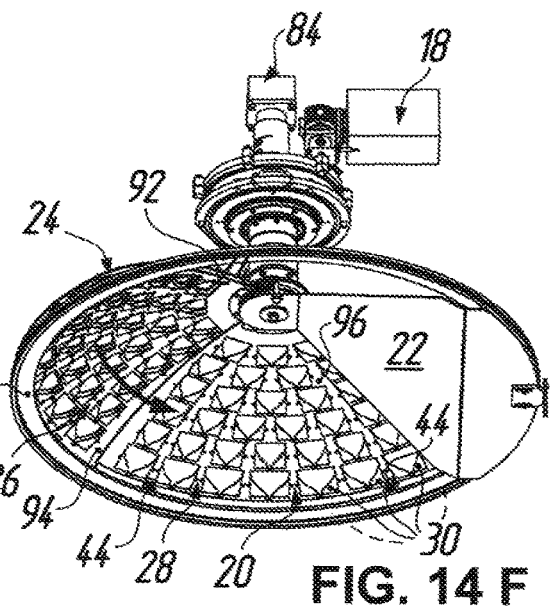
Figure 14:
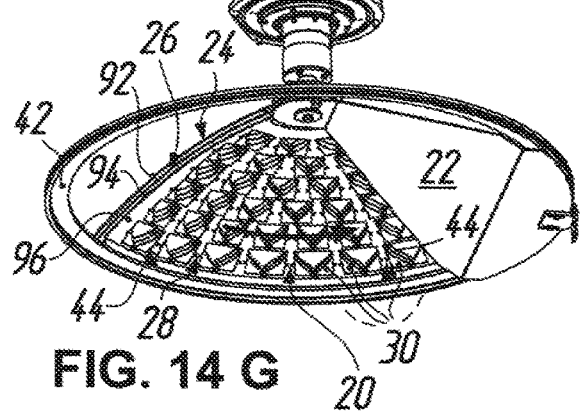
Figure 14:
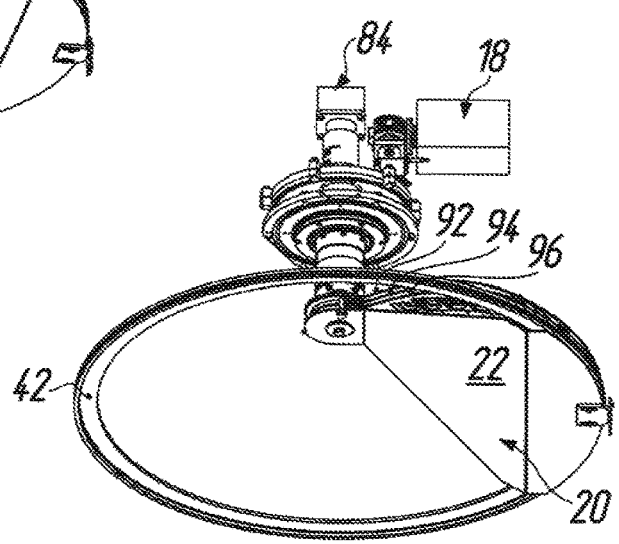
Figure 16:
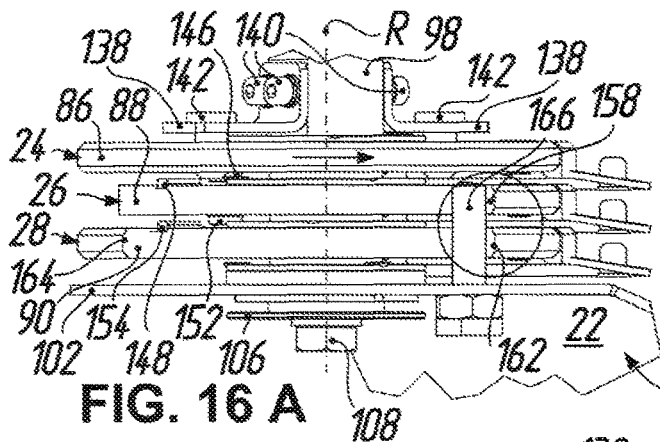
FIG. 16 A to FIG. 16 H show cut-out front views of the stacked hub sections of the three gradient sector portions according to FIGS. 14 A to 14 H, further illustrating the closing and opening motion sequences, respectively, of the three gradient sector portions from the gradient mask open position to the gradient mask closed position (FIGS. 16 A to 16 D) and vice versa (FIGS. 16 E to 16 H), corresponding to the sequences shown in FIGS. 14 A to 14 H and 15 A to 15 H.
Figure 16:
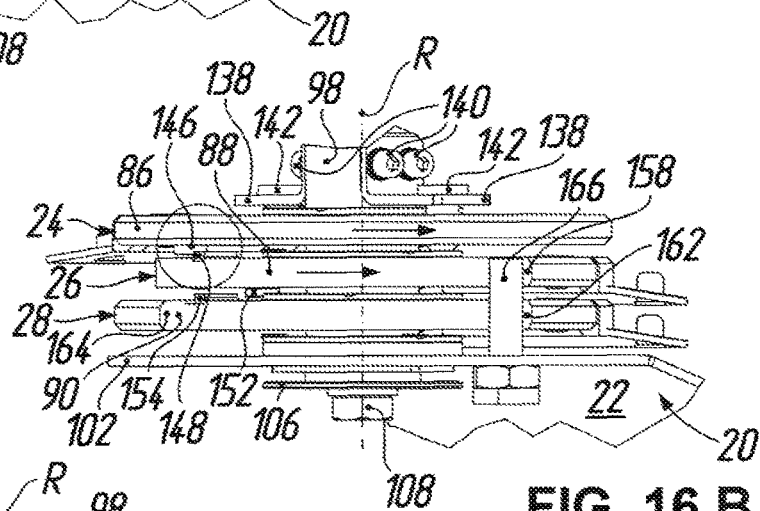
Figure 16:
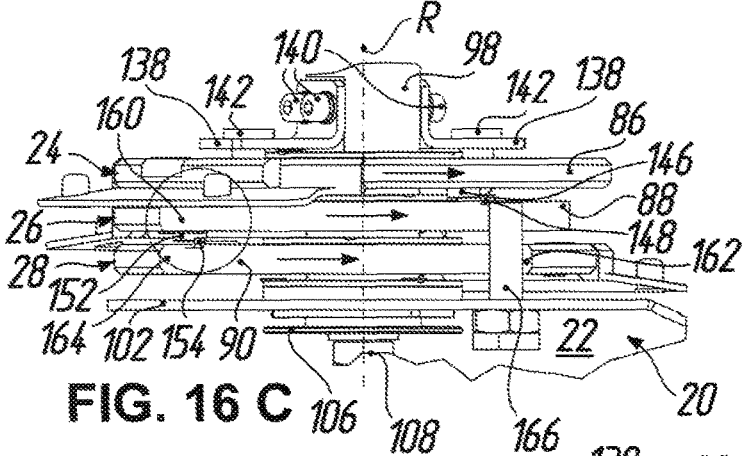
Figure 16:
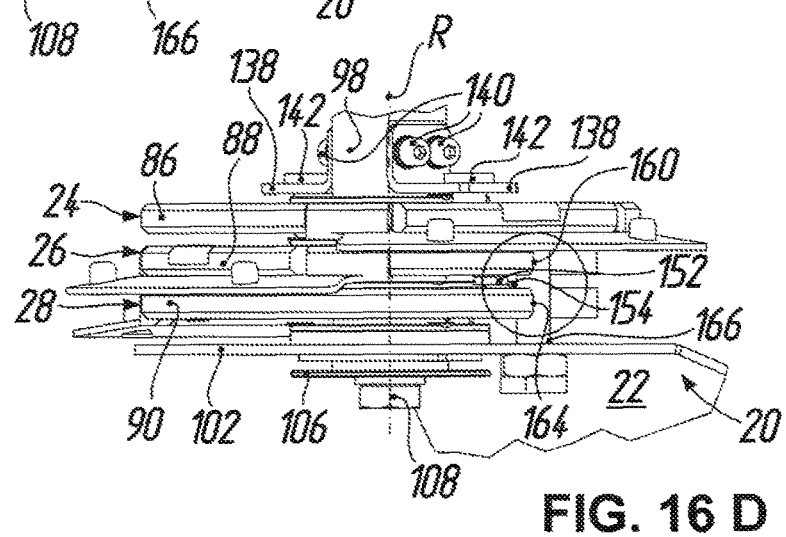
Figure 16:
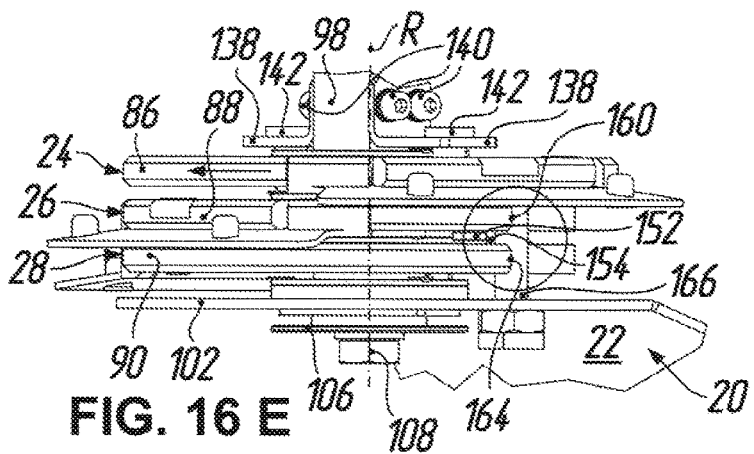
Figure 16:
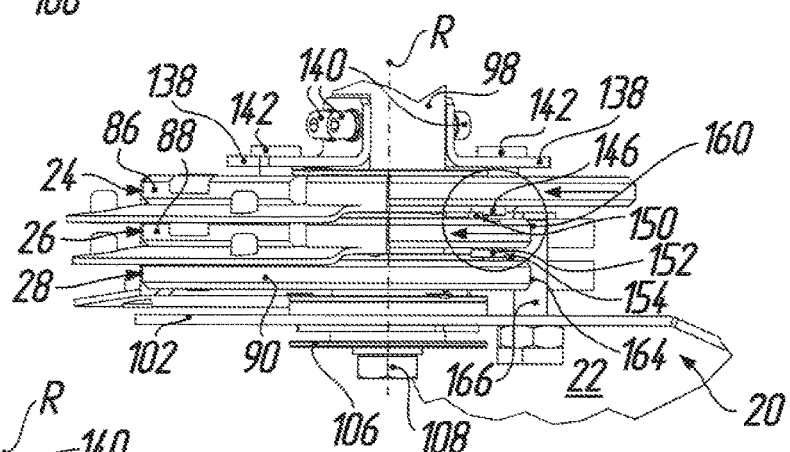
Figure 16:
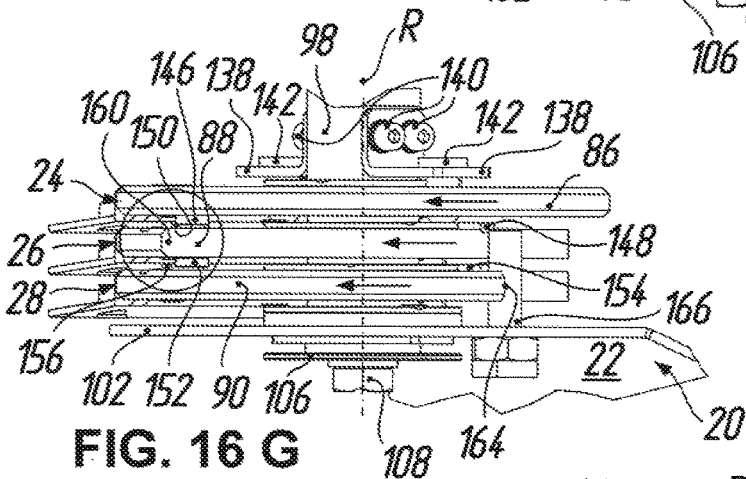
Figure 16:
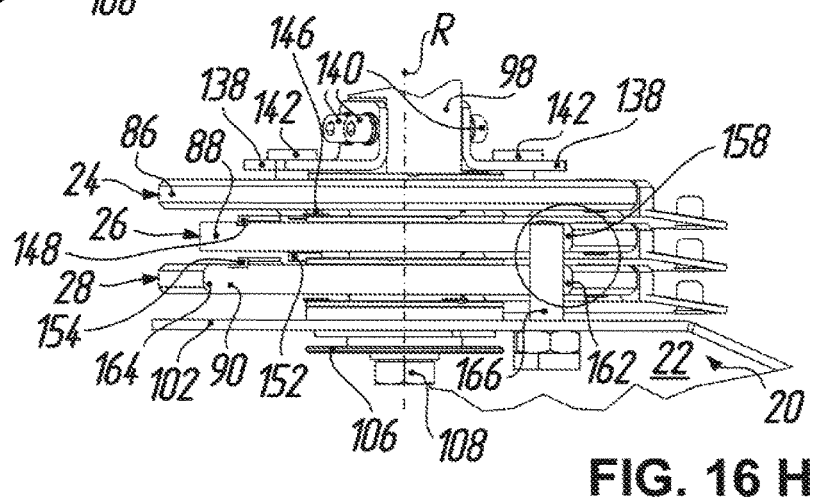

In operation, starting from the gradient mask open position shown in FIG. 14 A, in which both the abutment shoulder 158 of the middle hub section 88 and the abutment shoulder 162 of the undermost hub section 90 contact the stop pin 166 (cf. the encircled detail in FIG. 16 A), the hub section 86 of the upper gradient sector portion 24 is rotated via the central shaft 98 driven by the masking rotary drive 84 about the axis of rotation R in the counter-clockwise direction in FIG. 15 A as represented by the arrow in FIG. 15 A. Upon rotation of about 90 degrees of the gradient sector portion 24 (see FIG. 14 B) the engagement pin 146 of the upper hub section 86 contacts the key 148 of the middle hub section 88 (cf. FIG. 15 B and the encircled detail in FIG. 16 B) whereupon the middle hub section 88 and thus the gradient sector portion 26 is rotated together with the upper hub section 88 of the gradient sector portion 24. Upon rotation of about 180 degrees of the gradient sector portion 24 (see FIG. 14 C) the engagement pin 152 of the middle hub section 88 contacts the key 154 of the undermost hub section 90 (cf. FIG. 15 C and the encircled detail in FIG. 16 C) whereupon the undermost hub section 90 and thus the gradient sector portion 28 is rotated together with the gradient sector portions 24, 26. Finally, upon rotation of about 270 degrees of the gradient sector portion 24 (see FIG. 14 D) the abutment shoulders 160, 164 of the middle and undermost hub sections 88, 90 jointly contact the stop pin 166 (cf. FIG. 15 D and the encircled detail in FIG. 16 D) to stop the closing movement of the masking arrangement 20. The gradient sector portions 24, 26, 28 are now fully swung out from their storage space behind the fixed masking portion 22 to evolve their shadowing effect on the substrates held by the substrate holder 16.

To open the masking arrangement 20 starting from the state shown in FIGS. 14 D, 14 E, 15 D, 15 E, 16 D, 16 E, i.e. the gradient mask closed position, the hub section 86 of the upper gradient sector portion 24 is pivoted by the masking rotary drive 84 via the central shaft 98 about the axis of rotation R in the clockwise direction in FIG. 15 E as represented by the arrow in FIG. 15 E, while the abutment shoulders 160, 164 of the middle and undermost hub sections 88, 90 remain in their contact state with the stop pin 166. Upon rotation of about 90 degrees of the gradient sector portion 24 (see FIG. 14 F) the engagement pin 146 of the upper hub section 86 contacts the other key 150 of the middle hub section 88 (cf. FIG. 15 F and the encircled detail in FIG. 16 F) whereupon the middle hub section 88 and thus the gradient sector portion 26 is again rotated together with the upper hub section 88 of the gradient sector portion 24. Upon rotation of about 180 degrees of the gradient sector portion 24 (see FIG. 14 G) the engagement pin 152 of the middle hub section 88 contacts the other key 156 of the undermost hub section 90 (cf. FIG. 15 G and the encircled detail in FIG. 16 G) whereupon the undermost hub section 90 and thus the gradient sector portion 28 is rotated again together with the gradient sector portions 24, 26. Finally, upon rotation of about 270 degrees of the gradient sector portion 24 (see FIG. 14 H) the abutment shoulders 158, 162 of the middle and undermost hub sections 88, 90 jointly contact the stop pin 166 from the other side (cf. FIG. 15 H and the encircled detail in FIG. 16 H) to stop the opening movement of the masking arrangement 20. In this state further rotation of the upper hub section 86 and thus the gradient sector portion 24 is prevented inter alia by the contact between the engagement pin 146 of the upper hub section 86 and the key 150 on the middle hub section 88 that is stopped by the stop pin 166. The gradient sector portions 24, 26, 28 are now fully stored again in their storage space behind the fixed masking portion 22 to allow for direct impingement of the evaporation material emitted from the evaporation source 14 on the substrates held by the substrate holder 16.

Figure 10:
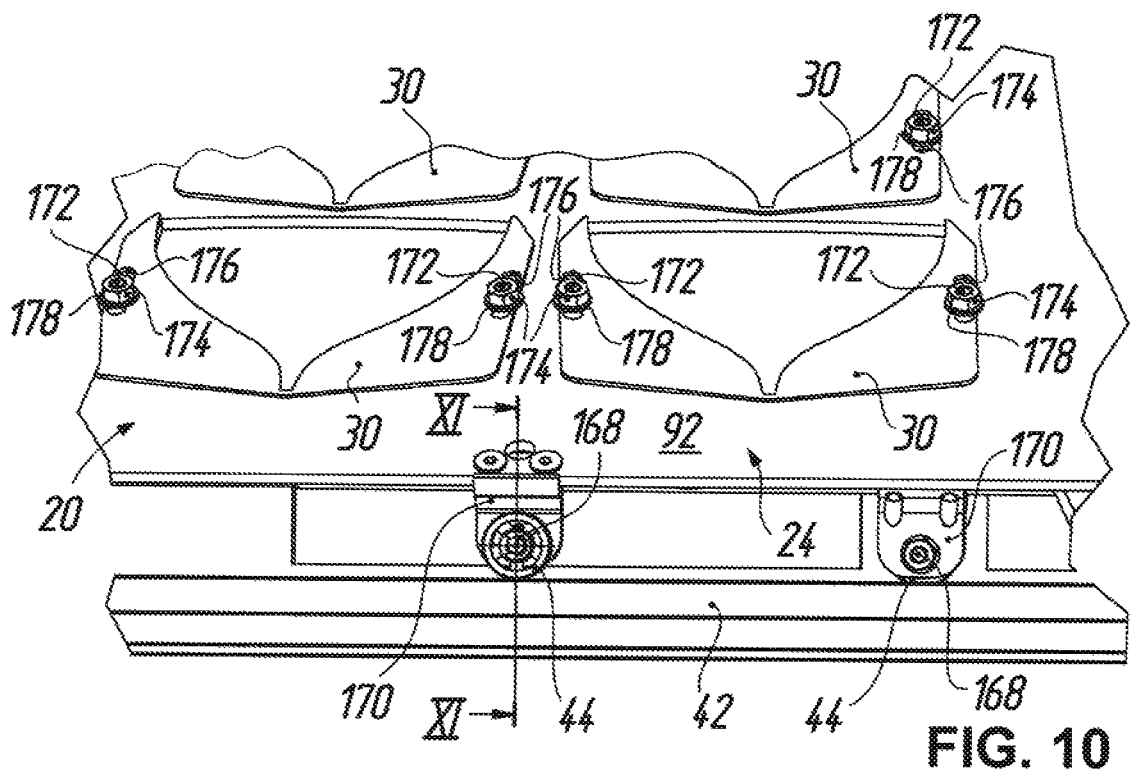
FIG. 10 shows a cut-out perspective view of the masking arrangement of the box coating apparatus according to FIG. 1, obliquely from the front and right and to an enlarged scale, illustrating how free ends of the gradient sector portions remote from the central axis of rotation are provided with rollers that are arranged to roll, upon rotation of the gradient sector portions about the central axis of rotation, on an assigned stationary guiding rail forming a horizontal circa a path throughout the vacuum chamber, and circularly surrounding the central axis of rotation in order to support the gradient sector portions at their free ends against gravity.
Figure 11:
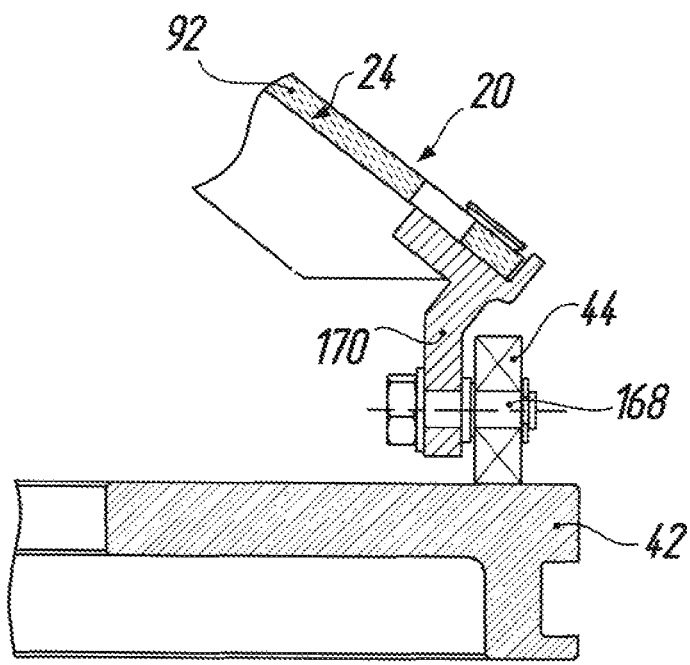
FIG. 11 shows a cut-out sectional view, to a further enlarged scale, of the masking arrangement of FIG. 10 in correspondence with the section line XI-XI in FIG. 10, for further illustration of the attachment of the rollers to the gradient sector portions and the rolling contact between the rollers and the guiding rail.

Further details of the rolling axial support of the gradient sector portions 24, 26, 28 on the guiding rail 42 in the vacuum chamber 12 can be derived from FIGS. 10 and 11. Accordingly, the rollers 44, which are suitably configured to roll on the guiding rail 42, e.g. with the aid of rolling bearings, are mounted by screw axes 168 on holding arms 170. The holding arms 170 provide for a defined vertical distance between the respective gradient sector portion 24, 26, 28 and the guiding rail 42, and are suitably bolted to free edges of the circle segments 92, 94, 96 of the gradient sector portions 24, 26, 28, as exemplarily shown for one roller 44 at the circle segment 92 of the gradient sector portion 24 in FIGS. 10 and 11.

Figure 12:
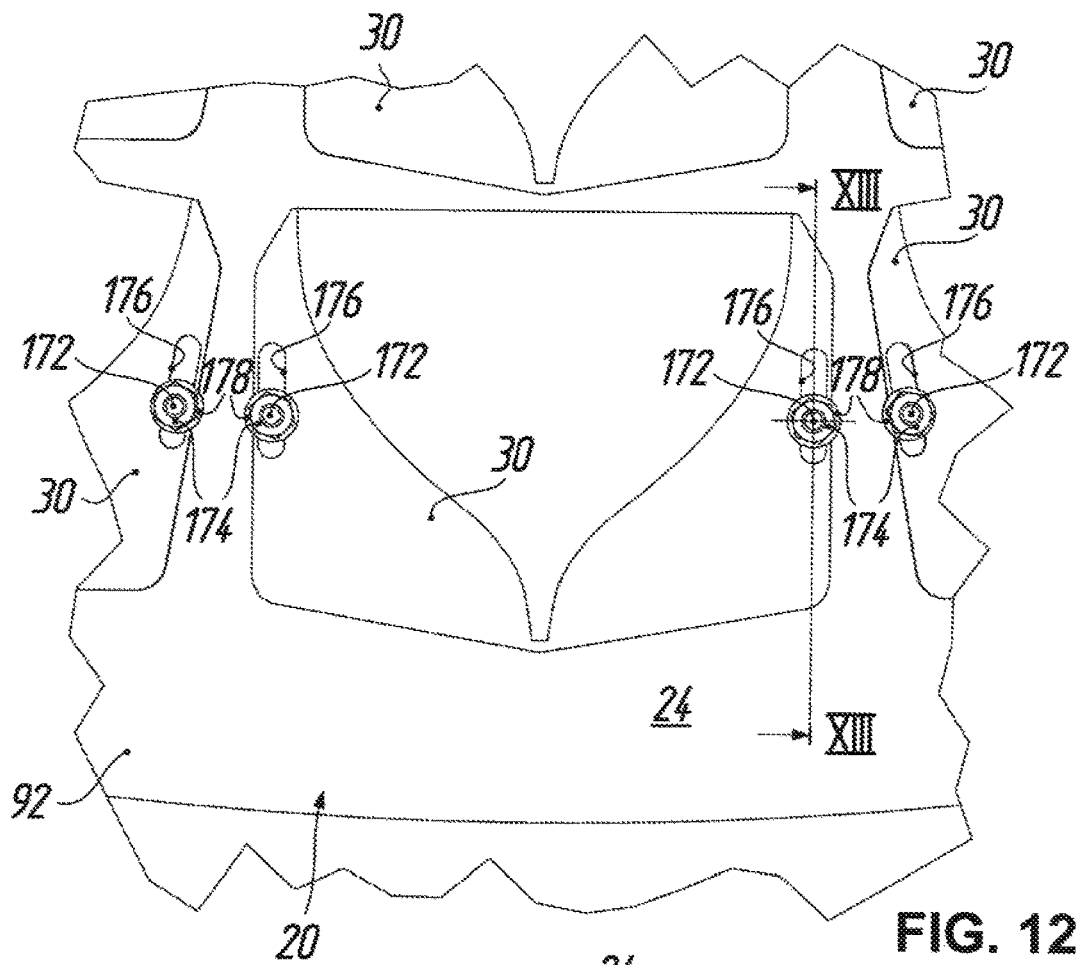
FIG. 12 shows a cut-out plan view of a gradient sector portion of the masking arrangement of the box coating apparatus according to FIG. 1, in a viewing direction upright on the gradient sector portion and to an enlarged scale, illustrating how gradient shields are mounted to the gradient sector portions to be interchangeable and adjustable with regard to their shadowing effect.
Figure 13:
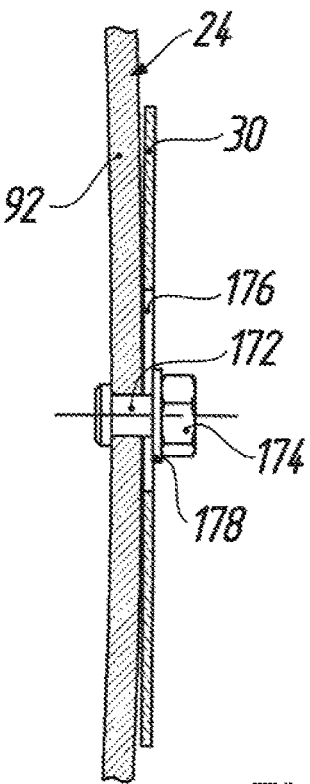
FIG. 13 shows a cut-out sectional view, to a further enlarged scale, of the gradient sector portion of FIG. 12 in correspondence with the section line XIII-XIII in FIG. 12, for further illustration of the adjustable mounting of the gradient shields to the gradient sector portions with the aid of screw members and oblong holes.

Finally, FIGS. 10, 12 and 13 illustrate how the gradient shields 30 can be mounted to the gradient sector portions 24, 26, 28 to be interchangeable and also to be adjustable with regard to their shadowing effect. Accordingly, mounting of the gradient shields 30 to the gradient sector portions 24, 26, 28 is carried out using screw members 172 bolted to the one part, i.e. to the circle segment 92 in the example shown, with the aid of nuts 174, and passing through oblong holes 176 in the other part, i.e. the gradient shields 30 in the present example, with washers 178 being interposed between the nuts 174 and the gradient shields 30. It is evident that the gradient shields 30 can thus be adjusted with regard to their shadowing effect by laterally shifting the gradient shields 30 along the oblong holes 176 relative to the gradient sector portions 24, 26, 28 prior to tightening the screw members 172 and nuts 174, respectively, so that the respective gradient shield 30 partly covers an assigned substantially square opening in the respective circle segment 92, 94, 96 to a defined extent.

A box coating apparatus for vacuum coating of substrates comprises a vacuum chamber containing an evaporation source and a substrate holder formed as a dome vis-à-vis to the evaporation source and rotatable about an axis. A masking arrangement is located in between for partially shadowing the substrates on the substrate holder relative to the evaporation source. The masking arrangement comprises a fixed masking portion stationary in the vacuum chamber, and a plurality of gradient sector portions carrying gradient shields assigned to the substrates on the substrate holder, for forming a gradient mask. The gradient sector portions can be rotated about said axis between a gradient mask open position where they are stored behind the fixed masking portion, and a gradient mask closed position where they are spread like a fan between the evaporation source and the substrate holder.

Variations and modifications are possible without departing from the scope and spirit of the present invention as defined by the appended claims.

We claim:

1. A box coating apparatus for vacuum coating of substrates, in particular spectacle lens blanks, comprising a vacuum chamber which contains an evaporation source and a substrate holder for holding a plurality of substrates, said substrate holder being formed as a dome disposed relative to said evaporation source and rotatable by a dome rotary drive about an axis of rotation that passes through said evaporation source, so that substrates held by said substrate holder can be moved on circular paths about said axis of rotation, with a respective constant spacing relative to said evaporation source, wherein a masking arrangement is located in said vacuum chamber between said evaporation source and said substrate holder for partially shadowing the substrates held by said substrate holder relative to said evaporation source, characterized in that said masking arrangement comprises a fixed masking portion that is stationary in said vacuum chamber, and a plurality of gradient sector portions each carrying gradient shields assigned to the substrates held by said substrate holder, for forming a gradient mask, wherein said gradient sector portions can be rotated about said axis of rotation between a gradient mask open position in which said gradient sector portions are stored behind said fixed masking portion, and a gradient mask closed position in which said gradient sector portions are spread like a fan between said evaporation source and said substrate holder.

2. The box coating apparatus according to claim 1, characterized in that said masking arrangement comprises three gradient sector portions which are about the same size and shape and can be stored behind said fixed masking portion in a stacked arrangement.

3. The box coating apparatus according to claim 2, characterized in that said gradient sector portions are swivel-mounted in said vacuum chamber by a common central shaft aligned with said axis of rotation.

4. The box coating apparatus according to claim 3, characterized in that a first one of said gradient sector portions is connected to rotate with said central shaft, whereas the other gradient sector portions are mounted on said central shaft to be pivotable with respect to said central shaft, said other gradient sector portions further being adapted to be taken along by said first gradient sector portion in a successive manner upon rotation thereof with said central shaft so as to either close or open said gradient mask depending on the direction of rotation of said central shaft.

5. The box coating apparatus according to claim 4, characterized in that adjacent gradient sector portions in each case comprise cooperating driving projections which are arranged to successively come into engagement with each other upon rotation of said central shaft.

6. The box coating apparatus according to claim 5, characterized in that each of said other gradient sector portions is provided with two abutment shoulders defining an open position and a closed position, respectively, of the respective gradient sector portion depending on the direction of rotation of said central shaft.

7. The box coating apparatus according to claim 6, characterized in that one stationary stop pin only is provided that cooperates with said abutment shoulders of said other gradient sector portions to serve as a stop in the open position and the closed position, respectively, of the respective gradient sector portion.

8. The box coating apparatus according to claim 7, characterized in that said substrate holder is drivingly connected to said dome rotary drive via a hollow shaft, said central shaft for swivel-mounting of said gradient sector portions in said vacuum chamber extending through said hollow shaft, so that said central shaft and said hollow shaft are concentrically arranged about said axis of rotation.

9. The box coating apparatus according to claim 8, characterized in that said gradient sector portions are rotatable about said axis of rotation between said gradient mask open position and said gradient mask closed position by a masking rotary drive.

10. The box coating apparatus according to claim 9, characterized in that said masking rotary drive is located outside of said vacuum chamber and drivingly connected to said central shaft within said vacuum chamber via a rotary feed through.

11. The box coating apparatus according to claim 10, characterized in that said masking rotary drive is a pneumatic motor.

12. The box coating apparatus according to claim 11, characterized in that said gradient sector portions (24, 26, 28) are provided with rollers at their free ends remote from said axis of rotation, said rollers (44) being arranged to roll on an assigned guiding rail upon rotation of said gradient sector portions about said axis of rotation, wherein said guiding rail (42) is within and circumscribed by said vacuum chamber and is stationary mounted to support said gradient sector portions at their free ends against gravity.

13. The box coating apparatus according to claim 12, characterized in that said gradient shields are mounted to said gradient sector portions to be interchangeable.

14. The box coating apparatus according to claim 13, characterized in that said gradient shields are mounted to said gradient sector portions to be adjustable with regard to their shadowing effect.

15. The box coating apparatus according to claim 14, characterized in that mounting of said gradient shields to said gradient sector portions is carried out using screw members bolted to the one part which pass through oblong holes in the other part, so that said gradient shields can be adjusted with regard to their shadowing effect by laterally shifting said gradient shields along said oblong holes relative to said gradient sector portions prior to tightening said screw members.

16. The box coating apparatus according to claim 4, characterized in that each of said other gradient sector portions is provided with two abutment shoulders defining an open position and a closed position, respectively, of the respective gradient sector portion depending on the direction of rotation of said central shaft.

17. The box coating apparatus according to claim 3, characterized in that said substrate holder is drivingly connected to said dome rotary drive via a hollow shaft, said central shaft for, swivel-mounting of said gradient sector portions in said vacuum chamber extending through said hollow shaft, so that said central shaft and said hollow shaft are concentrically arranged about said axis of rotation.

18. The box coating apparatus according to claim 1, characterized in that said gradient sector portions are rotatable about said axis of rotation between said radiant mask open position and said gradient mask closed position by a masking rotary drive.

19. The box coating apparatus according to claim 18, characterized in that said gradient sector portions are swivel-mounted in said vacuum chamber by a common central shaft aligned with said axis of rotation, wherein said masking rotary drive is located outside of said vacuum chamber and drivingly connected to said central shaft within said vacuum chamber via a rotary feed through.

20. The box coating apparatus according to claim 18, characterized in that said masking rotary drive is a pneumatic motor.

21. The box coating apparatus according to claim 1, characterized in that said gradient shields are mounted to said gradient sector portions to be interchangeable.

22. The box coating apparatus according to claim 1, characterized in that said gradient shields are mounted to said gradient sector portions to be adjustable with regard to their shadowing effect.

* * * * *